United States Patent [19]
Muranaka et al.

[11] Patent Number: 5,969,996
[45] Date of Patent: Oct. 19, 1999

[54] SEMICONDUCTOR MEMORY DEVICE AND MEMORY SYSTEM

[75] Inventors: Masaya Muranaka, Akishima; Shinichi Miyatake, Hamura; Yukihide Suzuki, Akishima; Kanehide Kenmizaki, Kodaira; Makoto Morino, Akishima; Tetsuya Kitame, Kodaira, all of Japan

[73] Assignee: Hiachi, Ltd., Tokyo, Japan

[21] Appl. No.: 09/144,526

[22] Filed: Aug. 31, 1998

Related U.S. Application Data

[62] Division of application No. 08/638,128, Apr. 26, 1996, Pat. No. 5,818,784.

[30] Foreign Application Priority Data

Apr. 25, 1995 [JP] Japan ..................................... 7-125892
Mar. 25, 1996 [JP] Japan ..................................... 8-94797

[51] Int. Cl.⁶ ................................................. H01L 27/10
[52] U.S. Cl. ............................... 365/189.01; 365/230.03; 365/229; 365/189.05; 365/222
[58] Field of Search ........................ 365/189.01, 230.01, 365/230.03, 229, 189.05, 222

[56] References Cited

U.S. PATENT DOCUMENTS

| | | | |
|---|---|---|---|
| 5,426,603 | 6/1995 | Nakamara et al. ..................... | 365/149 |
| 5,508,960 | 4/1996 | Pinkham ............................. | 365/189.01 |
| 5,511,031 | 4/1996 | Grover et al. ........................ | 365/208 |
| 5,701,269 | 12/1997 | Fujii ................................. | 365/210 |
| 5,796,671 | 8/1998 | Wahlstrom ......................... | 365/230.03 |
| 5,818,784 | 10/1998 | Muranaka et al. .................. | 365/230.03 |

Primary Examiner—Viet Q. Nguyen
Attorney, Agent, or Firm—Antonelli, Terry, Stout & Kraus, LLP

[57] ABSTRACT

Two memory cells in different memory arrays are simultaneously selected in accordance with the designation of a specific write operation mode to associate a logic 1 of a write signal with a state in which an electric charge exists in each capacitor. Further, a logic 0 of the write signal is associated with a state in which no electric charge exists in the capacitor to write the same write signal. Two dynamic memory cells in different memory arrays are simultaneously selected in accordance with the designation of a specific read operation mode to associate a state in which an electric charge exists in a capacitor of each dynamic memory cell with a logic 1 of a read signal and associate a state in which no electric charge exists in the capacitor with a logic 0 of the read signal in response to a write operation. Thus, the logics 1 of the two read signals are preferentially output.

43 Claims, 22 Drawing Sheets

NORMAL → NORMAL MEMORY CELL ACCESS MODE
DUAL → DUAL MEMORY CELL ACCESS MODE

FIG. 23

| EXTERNAL ADDRESSES | A0 A1 A2 A3 A4 A5 A6 A7 |
|---|---|
| INTERNAL ADDRESSES | AY0 AY1 AY2 AY3 AY4 AY5 AY6 AY7 |

FIG. 24

| EXTERNAL ADDRESSES | A8 A9 A10 A11 A12 A13 A14 A15 A16 A17 A18 A19 |
|---|---|
| INTERNAL ADDRESSES | AX0 AX1 AX2 AX3 AX4 AX5 AX6 AX7 AX8 AX9 AX10 AX11 |

FIG. 25

| ARRAY0 | MARY0 | /AX11 | MA0~3 | WD0~3 |
|---|---|---|---|---|
| ARRAY1 | MARY1 | /AX11 | MA4~7 | WD4~7 |
| ARRAY2 | MARY2 | AX11 | MA8~11 | WD8~11 |
| ARRAY3 | MARY3 | AX11 | MA12~15 | WD12~15 |

SEMICONDUCTOR MEMORY DEVICE AND MEMORY SYSTEM

CROSS-REFERENCE TO RELATED APPLICATION

This application is a divisional of application Ser. No. 08/638,128, filed Apr. 26, 1996, now U.S. Pat. No. 5,818,784, the entire disclosure of which is incorporated herein by reference.

BACKGROUND OF THE INVENTION

The present invention relates to a semiconductor memory device and a memory system, and principally to a high storage capacity type dynamic RAM (Random Access Memory) and a technique effective for use in a data holding technique employed in a memory system using the dynamic RAM.

There has been known a dynamic RAM wherein an oscillator, having an oscillating period or cycle which varies depending on the temperature, is provided to vary a refresh period or cycle according to a change in temperature, thereby reducing a data holding current that flows during self-refresh. This type of dynamic RAM has been disclosed in Japanese Patent Application Laid-Open No. 5-6663. There has been also known a dynamic RAM of a type wherein a plate voltage applied to each of dynamic memory cells is lowered during self-refresh to reduce a leakage current that flows through the dynamic memory cell. This type of dynamic RAM has been disclosed in the 1995 IEEE international Solid-State Circuit Conference, ISSCC 95/SESSION 14/DRAM/PAPER FA14, 1, "A Sub-0.5$\mu$ A/MB DATA-Retention DRAM".

In the former dynamic RAM, the oscillator, whose oscillating cycle varies depending on the temperature, automatically sets the optimum refresh cycle with respect to a change in data holding time due to a variation in ambient temperature of the dynamic RAM in order to minimize the data holding current in the self-refresh mode.

Now, the decision of the data holding time of each dynamic memory cell is made to cope with a leakage current developed in a PN junction dependent on structures of a MOSFET and a capacitor both of which constitute each memory or at an interface between a silicon substrate and an oxide film. It has been known that ones of the memory cells in the dynamic RAM, having data-holding times that relatively greatly depend on temperatures and a source voltage, command about 0.1% of the number of the entire memory cells. Further, memory cells (hereinafter called "worst memory cells") of a small number of these memory cells, which are shortest in data holding time, will determine the whole data holding time of the dynamic RAM.

SUMMARY OF THE INVENTION

The oscillator, whose cycle varies depending on the temperature, comprises pseudo memory cells composed of about 1000 actual memory cells connected in parallel, a precharge circuit and a comparison circuit for detecting a potential applied to each pseudo memory cell. The oscillator detects an effect of temperatures exerted on the actual memory cells on a simulation basis by detecting, as a drop in the potential of each pseudo memory cell, a decrease in electric charge stored in the pseudo memory cell based on a precharge signal. Therefore, the inventors, et al. of the present application have discovered a problem that since the oscillating period of the oscillator principally follows data holding times of the great majority of memory cells other than the small number of memory cells in the dynamic RAM, the corresponding memory cells are different from the worst memory cells that greatly depend on the temperature and the power source, whereby the optimum refresh cycle cannot be obtained.

The latter dynamic RAM is intended to lower a plate potential applied to each memory cell, which is normally Vcc/2, to Vss (reference potential) upon designation of the self-refresh mode and reduce a potential at a PN junction between capacitor portions of the memory cells. Since, however, a storage node of each memory cell can be lowered to a negative potential by coupling by reducing the plate potential of each memory cell to Vss, it is necessary to reduce the potential at a word line so as to correspond to the negative potential to prevent an address selection MOSFET whose gate is connected to the word line from being turned on. Further, the adverse effect of increasing the time required to return the self-refresh mode to a normal access mode is produced.

An object of the present invention is to provide a semiconductor memory device and a memory system wherein a data holding function with a high degree of reliability can be provided owing to a simple structure. Another object of the present invention is to provide a semiconductor memory device and a memory system both capable of greatly reducing power consumption in a data holding mode (self-refresh mode). The above and other objects, and novel features of the present invention will become apparent from the description of the present specification and the accompanying drawings.

A summary of featured aspects of the invention disclosed in the present application will now be briefly described. Two memory cells in different memory arrays or dynamic RAMs are simultaneously selected in accordance with the designation of a specific write operation mode so that a logic 1 of a write signal is associated with a state in which an electric charge exists in the corresponding capacitor and a logic 0 of the write signal is associated with a state in which no electric charge exists in the capacitor, whereby the same write signal is written. Two dynamic memory cells in the different memory arrays are simultaneously selected in accordance with the designation of a specific read operation mode so that in correspondence with the write operation, a state in which an electric charge exists in a capacitor of each of the two dynamic memory cells, referred to above, is associated with a logic 1 of a read signal and a state in which no electric charge exists in the capacitor, is associated with a logic 0 of the read signal. Further, a logic 1 level associated with two read signals are preferentially outputted. That is, a logic 1 level is outputted for the read signal under a condition in which either or both of the selected memory cells have an electric charge stored therein indicative of a logic 1 write signal.

According to the aforementioned means, since the data can be read from the other of the two memory cells even if the information stored in one of the two memory cells is destroyed due to the leakage current, by associating the state in which the electric charge exists in each of the capacitors of the two memory cells with the logic 1 in the data holding state or the like and preferentially outputting it, the data can be held with high reliability and the refresh cycle can be made long according to the average memory cell, thus making it possible to greatly reduce power consumption.

BRIEF DESCRIPTION OF THE DRAWINGS

The present invention will be described with reference to the accompanying drawings in which:

FIGS. 21(A) and 21(B,) are respectively characteristic diagrams of refresh operations dependent on temperatures, which have experimentally been obtained in the dynamic RAM shown in FIG. 20;

FIG. 23 is a correspondence diagram showing the layout of external and internal addresses;

FIG. 24 is a correspondence diagram illustrating the layout of external and internal addresses; and FIG. 25 is a diagram showing the relationship among the arrays ARRAY, memory arrays MARY shown in FIG. 1 and their corresponding addresses, main amplifiers and write drivers.

DETAILED DESCRIPTION OF THE PREFERRED EMBODIMENTS

Figure 1:
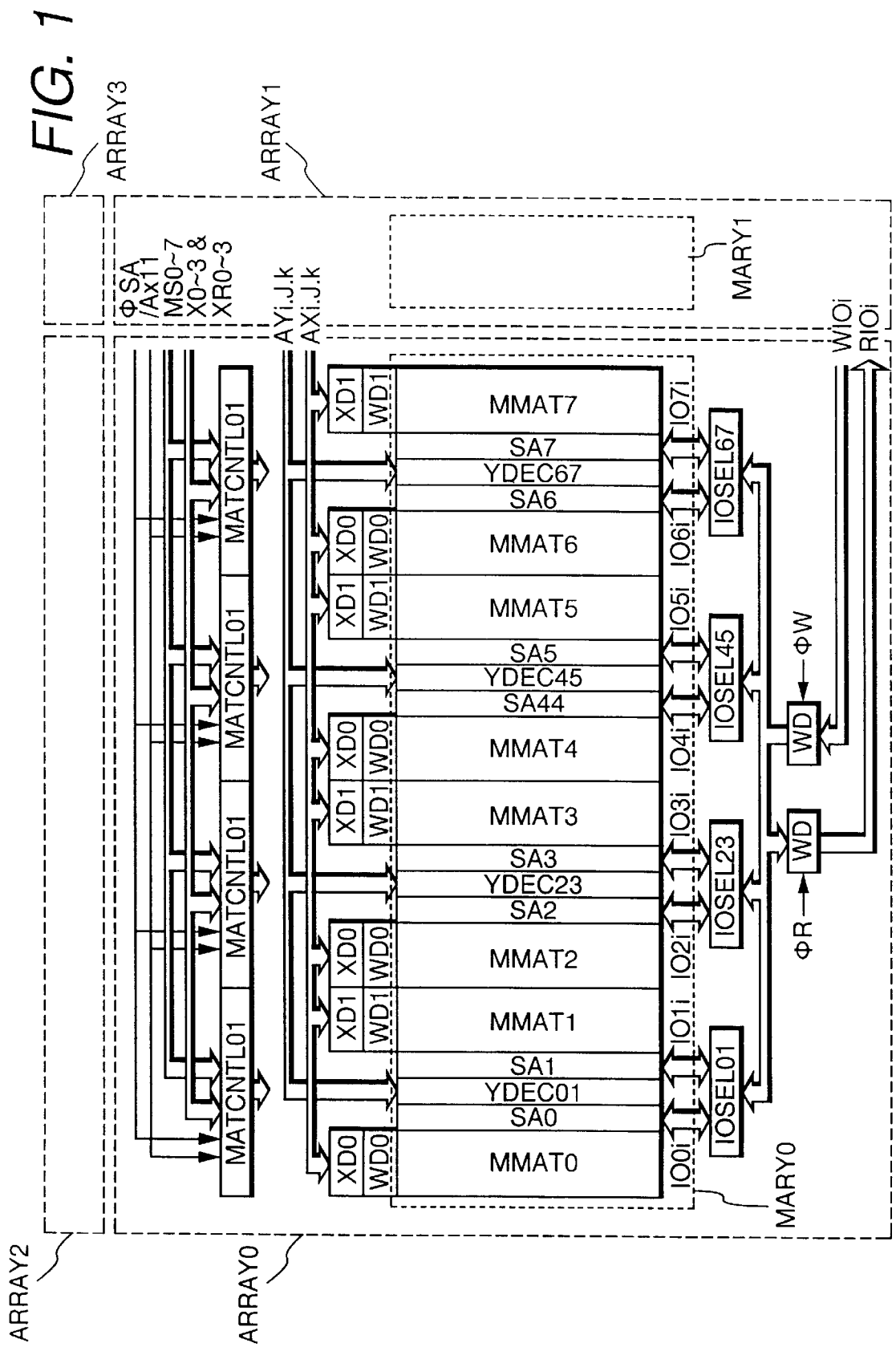
FIG. 1 is a block diagram showing examples of memory arrays and their peripheral selection circuits employed in a dynamic RAM to which the present invention is applied.
Figure 2:
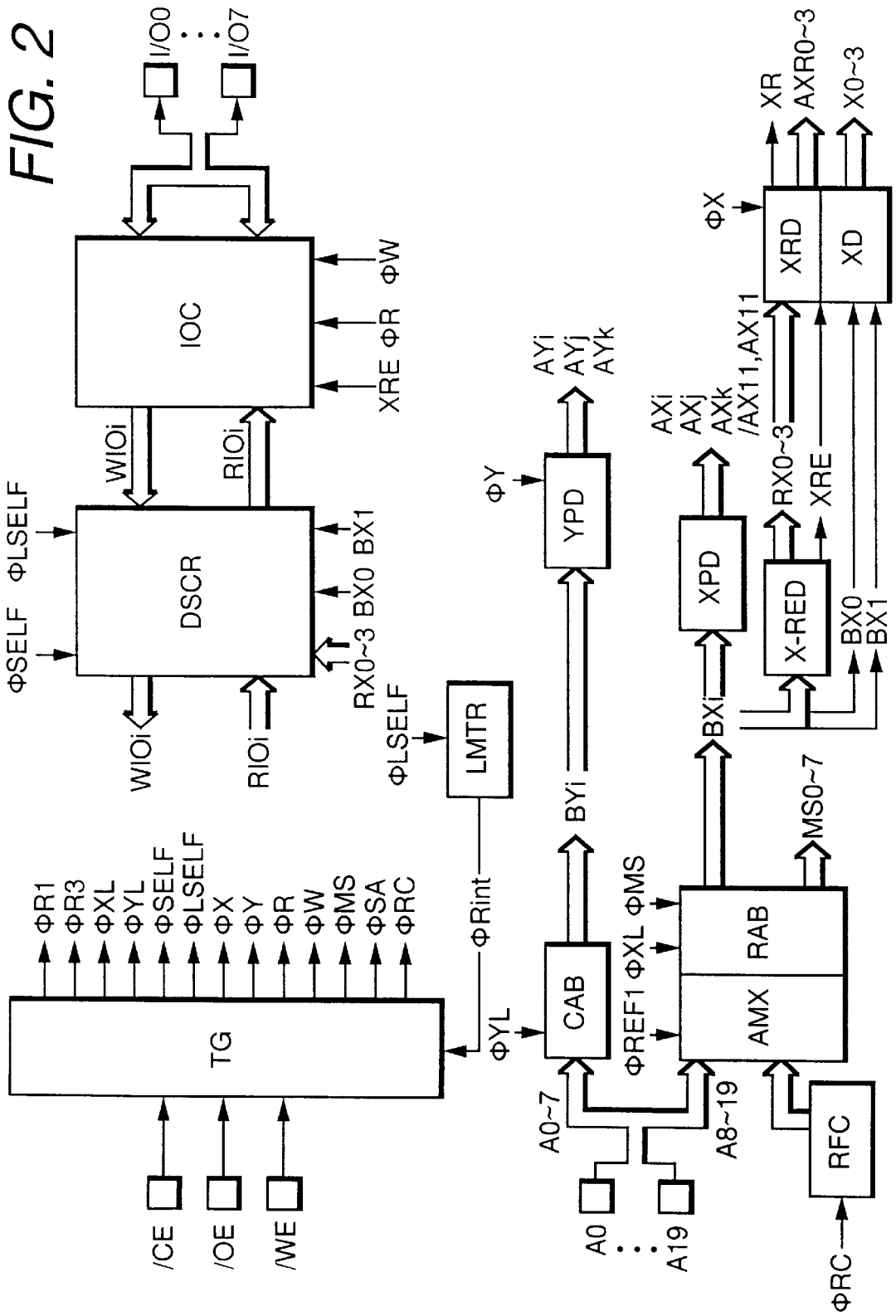
FIG. 2 is a block diagram illustrating examples of input/output interfaces and a timing control circuit employed in the dynamic RAM shown in FIG. 1.

FIGS. 1 and 2 are respectively block diagrams showing one embodiment of a dynamic RAM to which the present invention is applied. FIG. 1 illustrates memory arrays and their peripheral selection circuits. FIG. 2 shows input/output interfaces like address buffers or input/output buffers and a timing control circuit.

referring to FIG. 1, a Y decoder YDEC01 is provided so as to be interposed between both a memory mat MMAT0 and a sense amplifier SA0 connected thereto and both a memory mat MMAT1 and a sense amplifier SA1 connected thereto. Although not shown in the drawing, the sense amplifiers SA0 and SA1 are respectively provided with Y (column) selection switches. The sense amplifier SA0 and complementary bit lines (which may be called "complementary data lines or complementary digit lines") thereof and the sense amplifier SA1 and complementary bit lines thereof are respectively electrically connected to input/output lines IO0i and IO1i in response to a signal output from the Y decoder YDEC01.

Other memory mats MMAT2 and MMAT3, MMAT4 and MMAT5 and MMAT6 and MMAT7 are respectively provided with sense amplifiers SA2 and SA3, SA4 and SA5 and SA6 and SA7. A Y decoder YDEC23 is interposed between the sense amplifiers SA2 and SA3 and is shared between the two memory mats MMAT2 and MMAT3. Further, a Y decoder YDEC45 is interposed between the sense amplifiers SA4 and SA5 and is used commonly to the two memory mats MMAT4 and MMAT5. Furthermore, a Y decoder DEC57 is interposed between the sense amplifiers SA6 and SA7 and is shared between the two memory mats MMAT6 and MMAT7.

Either one of the input/output lines IO0i and IO1i is electrically connected to both an input terminal of a main amplifier MA composed of four circuits and an output terminal of a write driver WD composed of four circuits through an input/output line selection circuit IOSEL01 in accordance with a control signal outputted from a mat control circuit MATCNTL01,which will be described later.

The memory mats MMAT0 through MMAT7 are provided with their corresponding decoders XD0 and XD1. These decoders XD0 and XD1 decode a signal AX$i$ outputted from a predecoder circuit XPD,to be described later,to create signals for selecting four word lines. Word drivers WD0 and WD1 are respectively provided which form word line select signals based on signals outputted from the decoders XD0 and XD1 and mat control circuits MATCNTL01 through MATCNTL67, which will next be described. Word drivers associated with spare word lines for the relief of defects are also included in the word drivers.

The mat control circuit MATCNTL01 is provided so as to correspond to the pair of memory mats MMAT0 and MMAT1. The mat control circuits MATCNTL23, MATCNTL45 and MATCNTL67, similar to the above, are respectively provided so as to correspond to the pairs of memory mats MMAT2 and MMAT3, MMAT4 and MMAT5 and MMAT6 and MMAT7. The mat control circuits MATCNTL01 through MATCNTL67 respectively receive mat select signals MS0 through MS7, an address signal /AX11 of the most significant bit and a sense operation timing signal φSA, address signals X0 through X3 each represented by the two rightmost bits, and redundant signals XR0 through XR3. One mat control circuit corresponding to the selected memory mat outputs a signal for selecting one of the four word lines. Otherwise, each of the mat control circuits MATCNTL01 through MATCNTL67 outputs a signal for bringing a bit line precharge switch into an off state in correspondence to the selected memory mat and a timing signal for starting the operation for amplification of each sense amplifier.

When an access to a defective word line is performed, the operation for selecting the defective word line is stopped. Since a select signal on the redundant circuit side is formed by one of the select signals XR0 through XR3 as an alternative to this operation, the corresponding spare word line is brought into a selected state. Although the internal configurations of other arrays ARRAY1 through ARRAY3 are omitted from the same drawing, the arrays ARRAY1 through ARRAY3 are composed of memory arrays and their peripheral circuits similar to those that constitute the array ARRAY0.

Referring to FIG. 2, the timing control circuit TG is responsive to a chip enable signal /CE, an output enable signal /OE and a write enable signal /WE respectively supplied from external terminals to create various timing signals necessary to make a decision as to an operation mode and operate internal circuits correspondingly. In the present embodiment, an interface of the dynamic RAM serves so as to have compatibility with a static RAM regardless of the dynamic RAM as described above. Namely, a system for supplying row- and column-system address signals from separate address terminals is adopted without adopting an address multiplex system wherein the row- and column-system address signals are sequentially inputted from a common address terminal in synchronism with an address strobe signal as in the case of the normal dynamic RAM. In the present specification and drawings, symbol / is used to indicate that a low level is an active level.

Signals φR1 and φR3, outputted from the timing control circuit TG, respectively, are row-system basic timing signals and are used for a row-system selecting operation to be described later. A timing signal φXL is a signal for taking in or capturing a row-system address and holding it, which is supplied to a row address buffer RAB. Namely, the row address buffer RAB takes in or captures addresses inputted from address terminals A8 through A19 of address terminals A0 through A19 in response to the timing signal φXL and allows a latch circuit to hold them therein.

A timing signal φYL is a signal for capturing a column-system address and holding it, which is supplied to a column address buffer CAB. That is, the column address buffer CAB captures addresses inputted from the address terminals A0 through A7 of the address terminals A0 through A19 in response to the timing signal φYL and allows a latch circuit to retain them therein.

A signal φREF, generated during a refresh mode, is supplied to a multiplexer AMX provided in an input portion of the row address buffer RAB and effects control so that the multiplexer AMX selects a refresh address signal generated from a refresh address counter circuit RFC during the refresh mode. The refresh address counter circuit RFC counts a refresh step pulse (clock signal CLK) φRC produced from a timer circuit included in the timing control circuit TG to create a refresh address signal. The present embodiment is constructed so as to have auto and self refreshing operations.

A timing signal φX is a word line select timing signal, which is supplied to a decoder XD and a redundant decoder XRD from which four kinds of word line select timing signals X0 through X3 and AXR0 through AXR3 are generated based on decoded signals of address signals of the two rightmost bits. A row-system predecoder XPD decodes an internal address signal BXi to create predecode signals AXi, AXj and AXk. A timing signal φY is a column select timing signal, which is supplied to a column-system predecoder YPD together with an internal address signal BYi, from which column predecode signals AYi, AYj and AYk are created.

A timing signal φW is a control signal for providing instructions for a write operation, whereas a timing signal φR is a control signal for providing instructions for a read operation. These timing signals φW and φR are supplied to an input/output circuit I/O. In the write operation, the former signal activates an input buffer included in the input/output circuit I/O and brings an output buffer thereof into an output high impedance state. On the other hand, in the read operation, the latter signal activates the output buffer and brings the input buffer into an output high impedance state.

A timing signal φMS is a signal for providing instructions for a mat selection operation, which is supplied to the row address buffer RAB from which mat select signals MS0 through MS7 are outputted in synchronism with the timing signal φMS. A timing signal φSA is a signal for providing instructions for the operation of each sense amplifier. In addition to the formation of a pulse for activating each sense amplifier based on the timing signal φSA, the timing signal φSA is also used to create signals for controlling a precharge completion operation of complementary bit lines and an operation for the separation between bit lines on the non-selected memory mat side.

In the present embodiment, a row-system redundant circuit X-RED is illustrated as a typical example. Namely, the row-system redundant circuit X-RED includes a memory or storage circuit for storing a failure address therein and an address comparison circuit. The row-system redundant circuit X-RED performs a comparison between the stored failure address and an internal address signal BXi outputted from the row address buffer RAB. If they mismatch with each other, then the row-system redundant circuit X-RED brings a signal XRE to a high level so as to make the operation of a normal circuit effective. If the input internal address signal BXi matches with the stored failure address, then the row-system redundant circuit X-RED sets the signal XRE to a low level so as to prohibit the normal circuit from selecting the failure word line and output select signals AXR0 through AXR3 for selecting a single spare word line.

Although omitted from FIG. 2, a circuit similar to the row-system circuit is provided even in the column system. When a memory access to a defective bit line is detected by the circuit, the circuit prohibits a column decoder YD from selecting the failure bit line and creates select signals for selecting a bit line provided as a spare as an alternative to the selection operation.

In the present embodiment, two kinds of refresh modes using signals φSELF and φLSELF are provided. The refresh mode based on the signal φSELF is of a normal self refresh mode, whereas the refresh mode based on the signal φLSELF is of a novel refresh mode proposed by the present application. Namely, when data is placed in a holding state over a relatively long time as in the case of battery backup or the like, a timer LMTR is activated in response to the signal φLSELF so as to generate a refresh pulse φRint. Based on the refresh pulse φRint, the timing control circuit TG generates a row-system basic clock φR1 so as to execute a refresh mode.

The signal φLSELF is called "low power self-refresh mode". A refresh cycle thereof is made longer in unison with an average data holding time of each memory cell, which is set by the temperature-dependent timer LMTR. Such an increase in refresh cycle makes effective a mode in which the data holding state continues over a relatively long period, e.g., a data holding mode with battery backup made under the condition in which a system power source has been shut down, for example.

When the refresh cycle is made longer as described above, the data stored in a few memory cells, which are likely to fall behind, are destroyed. To cope with this, the data is renewed in the following manner prior to the switching to the refresh mode based on the signal φLSELF. Namely, a storage area is reduced to half and the same data is written into two memory cells. When effective data exists in only an area which is half the whole storage area, for example, the same data is written into an empty or vacant area as it is and one data is stored in the two memory cells. If the effective data exists in a storage area which is more than half the total storage area, then the effective data is read out once and subjected to data compression. Further, areas covering half of each whole storage area are double-selected so that one data is stored in two memory cells. In correspondence with such writing of data, addresses /AX11 and AX11 (address terminal A19) of the most significant bits in an X system are both set to a selection level. Thus, two word lines are double-selected from a memory array so that the same data is written into the two memory cells brought into the selected state.

One of write data supplied from data terminals I/O0 through I/O7 for such a write operation is sent so as to be supplied to two memory cells by a data conversion circuit DSCR. On the other hand, since a read signal RIOi is read in a two-bit pair upon reading the above signal to be written, respective bit pairs are ORed by the data conversion circuit DSCR and a logical sum signal corresponding to the result of ORing is outputted through the data terminals I/O0 through I/O7 as a read signal.

Figure 3:
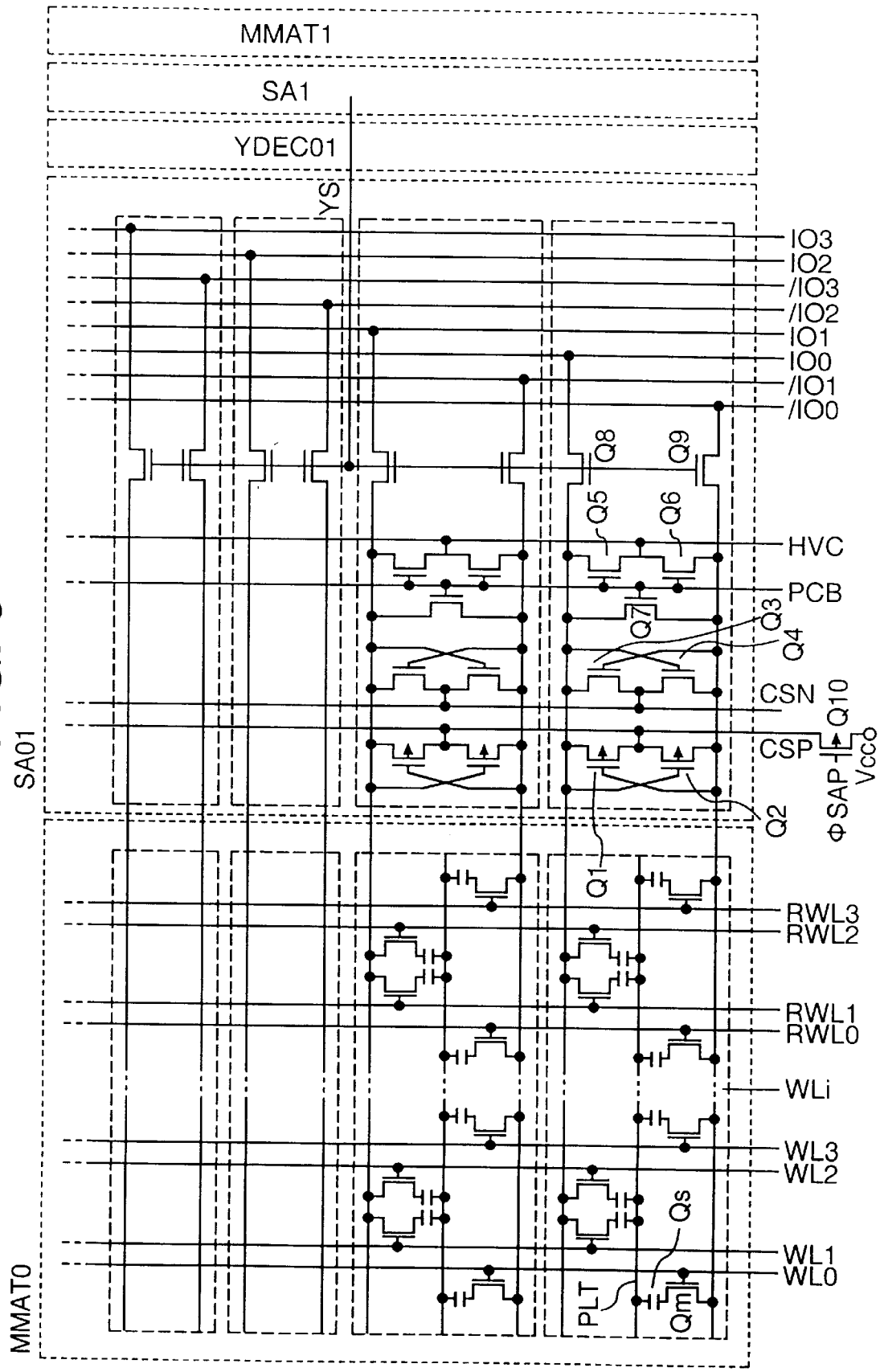
FIG. 3 is a fragmentary circuit diagram showing a memory array portion of the dynamic RAM shown in FIG. 1.

FIG. 3 is a fragmentary circuit diagram showing one example of a memory array portion of the dynamic RAM according to the present invention. The same drawing typically illustrates four word lines WL0 through WL3 of the memory mat MMAT0, redundant word lines RWL0 through RWL3, two pairs of complementary bit lines, and a sense amplifier and a precharge circuit and the like associated with these. The memory mat MMAT1 is illustrated as a black box. Further, circuit symbols are typically applied to only MOSFETs that constitute respective circuits corresponding to a pair of complementary bit lines.

Each dynamic memory cell is composed of an address selection MOSFET Qm and an information storage capacitor Cs. The gate of the address selection MOSFET Qm is electrically connected to its corresponding word line WL0 and the like and the drain thereof is electrically connected to its corresponding bit line. Further, the source of the MOSFET Qm is electrically connected with its corresponding information storage capacitor Cs. Other or plate electrodes of the information storage capacitors Cs associated with a pair of complementary bit lines are commonly coupled and supplied with a plate voltage PLT.

The above bit line pairs are arranged in parallel as shown in the same drawing and are allowed to suitably intersect as necessary to strike a balance between the capacities of the bit lines, for example. The respective complementary bit line pairs are electrically connected to their corresponding input/output nodes of the sense amplifier. Each sense amplifier is composed of N channel MOSFETs Q3 and Q4 and P channel MOSFETs Q1 and Q2 whose respective gates and drains are electrically cross-connected to one another so as to effect a latch circuit. The sources of the N channel MOSFETs Q3 and Q4 are electrically connected to a common source line CSN. The sources of the P channel MOSFETs Q1 and Q2 are electrically connected to a common source line CSP. As illustrated in the common source line CSP by way of example, a power switch MOSFET Q10 of the P channel MOSFET is provided. When a timing signal φSAP is rendered low in level, the MOSFET Q10 is turned on so as to supply a voltage necessary for the operation of each sense amplifier. An unillustrated N channel MOSFET is connected to the common source line CSN associated with N channel MOSFETs Q3 and Q4 so that a circuit ground potential is supplied to provide the timing for operating each sense amplifier.

In order to provide stable sense operations, power switch MOSFETs for activating the sense amplifiers may be activated in the following manner. Namely, for example, such a power switch MOSFET as being capable of supplying only a relatively small current when each sense amplifier has started its amplifying operation is brought into an on state, and such a power switch MOSFET as being able to supply a large current when the difference in potential between each individual bit line pair has been increased to some extent by the amplifying operation of each sense amplifier is brought into an on state, whereby a stepwise amplifying operation is performed.

A precharge circuit composed of a MOSFET Q7 for short-circuiting each complementary bit line pair and the MOSFET switches Q5 and Q6 for supplying a half precharge voltage HVC to each complementary bit line is connected to each input/output node of the sense amplifier. The gates of these MOSFETs Q5 through Q7 are commonly supplied with a precharge signal PCB.

MOSFETs Q8 and Q9 constitute a column switch, switch-controlled in accordance with a column select signal YS. In the present embodiment, four bit line pairs can be selected by one column select signal YS. Therefore, the column select signal YS is commonly supplied to the gates of MOSFETs that constitute column switches provided at input/output nodes of four sense amplifiers associated with the two pairs of bit lines illustrated in the same drawing, by way of example, and the remaining two pairs composed of bit lines alone. The four pairs of bit lines and four pairs of input/output lines /IO0, IO0 through /IO3 and IO3 are respectively connected to one another through such MOSFET switches.

The memory cells each composed of the switch MOSFET Qm and the capacitor Cs are connected to one and the other of each bit line pair at intervals of two cells. Namely, memory cells are respectively provided at points of intersection of one bit line and word lines (0+4N) and (3+4N) and memory cells are respectively provided at points of intersection of the other bit line and word lines (1+4N) and (2+4N), where N are 0, 1, 2, 3, . . . 63.

As described above, each memory cell composed of the switch MOSFET Qm and the capacitor Cs is electrically connected to one or the other of the bit line pair. Where a word line corresponding to the gate of a MOSFET Qm connected to a capacitor Cs is selected when the state of an electric charge stored in the capacitor Cs of a memory cell connected to one bit line is high in level, the potential of the bit line increases according to the charge share of the bit line and capacitor Cs so that a high level read signal is created by an amplifying operation of a sense amplifier subsequent to this increase in potential. Where the word line connected with the gate of the MOSFET Qm connected to the capacitor Cs is selected when the state of the electric charge stored in the capacitor Cs is low in level, the potential of the bit line decreases according to the charge share of the capacitor Cs and the bit line so that a low level read signal is created by an amplifying operation of a sense amplifier subsequent to this decrease in potential. Upon a write operation, a high level is supplied to the capacitor Cs when write information is high in level, whereas a low level is supplied to the capacitor Cs when the write information is low in level.

In the case of a memory cell connected to the reversed bit line of each bit line pair referred to above, the level of information to be read or written becomes opposite to the state of an electric charge in the memory cell. Namely, in the case of memory cells connected to the word lines WL (1+4N) and WL (2+4N), the level of input/output information is identical to the state of an electric charge stored in a capacitor of each memory cell. However, in the case of memory cells connected to the word lines WL (0+4N) and WL (3+4N), the level of input/output information becomes opposite to the state of an electric charge stored in a capacitor of each memory cell.

Therefore, the data conversion circuit shown in FIG. 2 is supplied with address signals BX0 and BX1 or RX0 through RX3 and performs a data conversion operation for converting the state of an electric charge to a logic 1 when its state is high in level, together with the supply operation. Namely, when the word lines (1+4N) and WL (2+4N) are selected, a read signal is input to an OR circuit as it is, whereas when the word lines (0+4N) and WL (3+4N) are selected, the read signal is reversed, followed by inputting to the OR circuit.

This means the following. In other words, the information is destroyed as in the case where the state of an electric charge in each of the memory cells whose data holding times are extremely short, which are likely to be left behind as it were, is brought from a high level to a low level due to a leakage current. On the other hand, when the state of the electric charge thereof is low in level, it remains unchanged as it is even if the leakage current flows. Thus, when the data is outputted as it is, for example, in the case where the state of the electric charge in each of the memory cells connected to the word lines WL (0+4N) and WL (3+4N), described above, is changed from high to low level due to the leakage, the high level data is preferentially outputted according to the above ORing operation even when the normal low level is outputted from the other memory cell, whereby incorrect data is outputted. Therefore, when the memory cells connected to the word lines WL (0+4N) and WL (3+4N) are selected as described above, their read levels are inverted, followed by supplying the same to the OR circuit.

In the present embodiment, the two memory cells are used so as to store the same data in the data holding mode. Since the number of the memory cells which are short in the data holding time and are likely to be left behind is extremely small, the two memory cells may be both regarded as ones free of falling behind. Therefore, even when one of the two memory cells, whose state of charge is to be kept high in level, is brought to a low level due to the formation of the output signal corresponding to the logic 1 by the logical sum signal referred to above, an output signal of a logic 1, corresponding to the high level at which the state of charge is represented, is obtained from the other memory cell.

By setting the data holding time of each memory cell to the average long cycle owing to the adoption of such a construction, the self-refresh period in the data holding state can be made longer and,correspondingly, current consumption in the data holding state can be reduced to the extent comparable to that of the static RAM. In the present embodiment, the use of the dynamic memory cells makes possible a great increase in storage capacity. Further, the compatibility between the input/output interface and the static RAM,as described above,makes it possible to replace the static RAM with the interface although there is no particular restraint on it.

Figure 4:
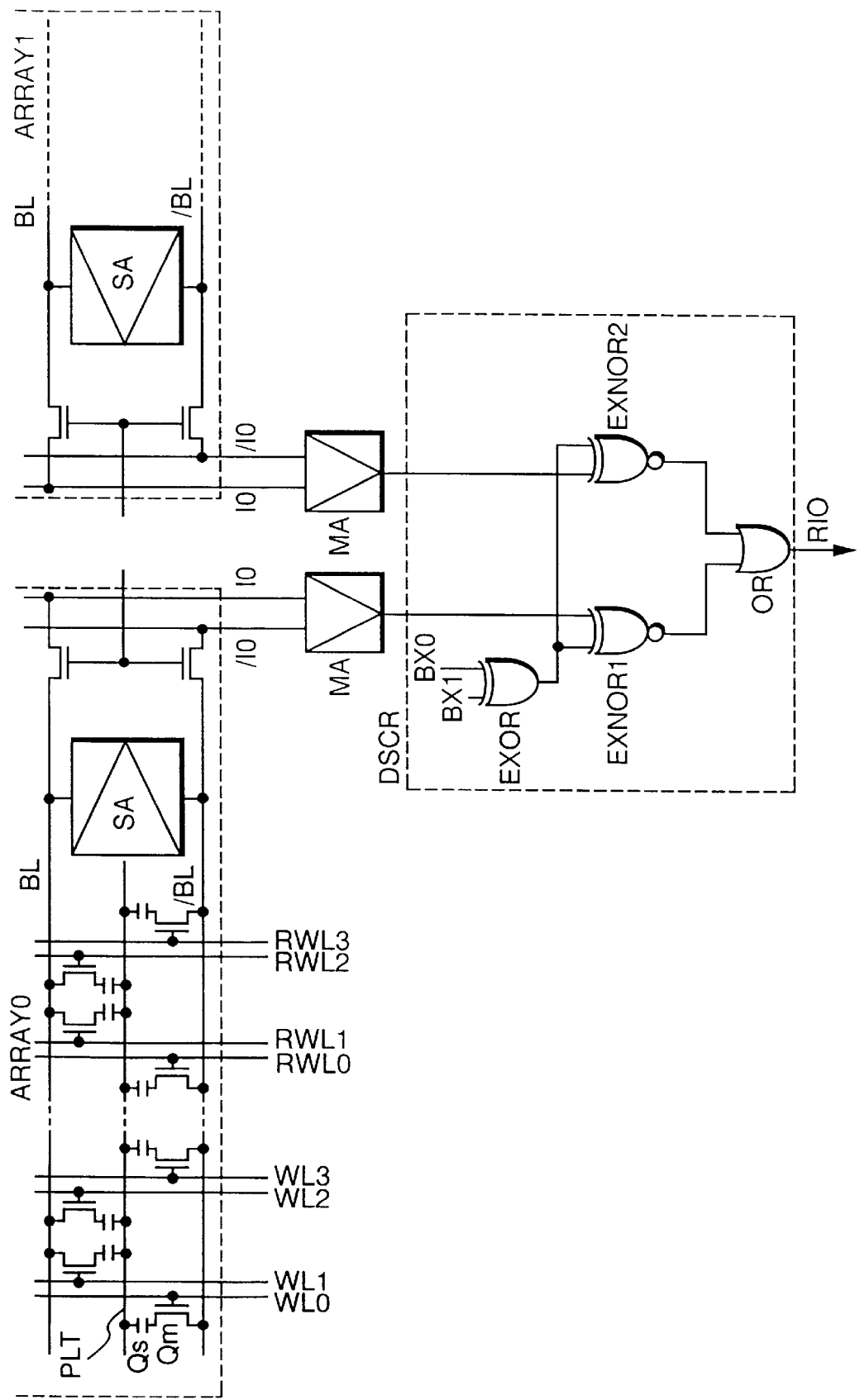
FIG. 4 is a schematic circuit diagram depicting one example of a read circuit of the dynamic RAM shown in FIG. 1.

FIG. 4 is a schematic circuit diagram of one example of a read system circuit included in the aforementioned data conversion circuit DSCR. In a memory array ARRAY0, memory cells each composed of a switch MOSFET Qm and a capacitor Cs are provided at points of intersection of bit lines BL and /BL on the non-inversion and inversion sides and word lines WL0 through WL3 between one bit line /BL of each complementary bit line pair and the other bit line BL thereof at intervals of two memory cells. Namely, as shown in FIG. 3, the memory cells are provided at the points of intersection of the one bit line /BL and the word lines WL0 and WL3 and the memory cells are provided at the points of intersection of the other bit line BL and the word lines WL1 and WL2. Subsequently, the memory cells are successively provided according to this rule. Similarly, spare memory cells are provided according to the rule in the same manner as described above, even in the case of redundant word lines RWL0 through PWL3. The other memory array ARRAY1 is not described in the same drawing but is identical in structure to the memory array ARRAY0.

When an electric charge of a capacitor Cs of each memory cell connected to one bit line /BL,referred to above,is read as being in a state in which the electric charge exists in the capacitor Cs, a logic 0 is output. Namely, since the bit line /BL becomes a high level and the bit line BL becomes a low level, input/output lines /IO and IO become high and low levels,respectively, when such a complementary bit line pair is selected by a column switch. Further, an amplified output signal produced from a main amplifier MA for amplifying the levels becomes a low level and hence a logic 0 is output in the case of one that assumes the positive logic. In such a memory cell, a logic 1 is output when the stored electric charge of high level disappears due to the leakage current and thereby reaches a low level. Thus, when the output of ORing of signals read from two memory cells is simply produced, the logic 1 corresponding to the destroyed data is preferentially read even though the read signal of the proper logic 0 is outputted from the other memory cell. In order to avoid this, the following data conversion circuit is provided.

In the semiconductor memory device according to the present embodiment, if the selected memory cell is connected to one bit line /BL as described above when the logic 1 is written into two memory cells of the memory arrays ARRAY0 and ARRAY1 in the specific write mode described above, data is converted into inverted data by the data conversion circuit DSCR so that the low and high levels are respectively sent to the input/outputs IO and /IO, whereby the high level indicative of presence of the electric charge is written into the corresponding information storage capacitor of each memory cell referred to above. Namely, the logic 1 is stored in the corresponding memory cell in the specific write mode described above if the electric charge uniformly exists in the capacitor, irrespective of whether a bit line connected to a memory cell to be noted is /BL or BL. If no electric charge exists in the capacitor, then the logic 0 is stored in the corresponding memory cell.

In order to perform the data conversion so that the logic 1 is output if the electric charge exists in each capacitor and the logic 0 is output if no electric charge exists in each capacitor when a specific read mode is designated, two memory arrays ARRAY0 and ARRAY1 are selected and memory cells connected to an inverted bit line /BL as in the case of word lines WL1 and WL3 are selected, the output of the main amplifier MA is subjected to conversion and synthesis by the data conversion circuit DSCR. The four word lines such as the word lines WL0 through WL3 are combined into a set and are respectively determined depending on outputs obtained by decoding address signals BX0 and BX1 of the two rightmost bits.

Namely, when the address signals BX0 and BX1 of the two rightmost bits are both at logic 0 or at logic 1, WL (0+4N) and WL (3+4N) such as the word lines WL0 and WL3 are selected. Therefore, an exclusive OR circuit detects the same logic levels 0 and 1 as those of the address signals BX0 and BX1 of the two rightmost bits and at that time forms a detected signal of the logic 0. Exclusive NOR circuits EXNOR1 and EXNOR2 respectively supplied with signals read through the main amplifiers MA from the two memory array ARRAY0 and ARRAY1 are controlled based on. the logic 0 indicative of the detected signal thereby to invert the read signals.

Namely, if the output signals from the main amplifiers MA for the two memory arrays ARRAY0 and ARRAY1 are respectively a high level (logic 1), then the signals are inverted to a low level (logic 0). If they are respectively a low level (logic 0), then the signals are inverted into a high level (logic 1).

When one of the address signals BX0 and BX1 of the two rightmost bits is of a logic 0 and the other thereof is at a logic 1, WL (1+4N) and WL (2+4N) such as the word lines WL1 and WL2 are selected. Therefore, the exclusive OR circuit EXOR detects a mismatch between the address signals BX0 and BX1 of the two rightmost bits and at that time produces a detected signal of a logic 1. The exclusive NOR circuits EXNOR1 and EXNOR2 respectively supplied with signals read through the main amplifiers MA from the two memory array ARRAY0 and ARRAY1 are controlled based on the logic 1 indicative of the detected signal so that the read signals are transmitted as they are.

Thus, the read signal associated with the write operation can be obtained so that the logic 1 is stored in the corresponding memory cell in the specific write mode as described above if the electric charge uniformly exists in each capacitor and the logic 0 is stored in the memory cell if no electric charge exists in each capacitor. In this case, owing to the setting of a refresh cycle to a relatively long period, the proper read signal can be obtained from the other memory cell upon reading the held data in a data holding mode even if the information stored in one of two memory cells is destroyed due to the leakage current.

Although not shown in the same drawing, a write system data conversion circuit consists of circuits similar to the exclusive OR circuit EXOR supplied with the address signals BX0 and BX1 of the two rightmost bits and the exclusive NOR circuits EXNOR1 and EXNOR2 controlled based on the detected signal. Data about write signals are converted as described above so as to be sent to input/output lines IO and /IO associated with memory arrays ARRAY0 and ARRAY1.

Figure 5A:
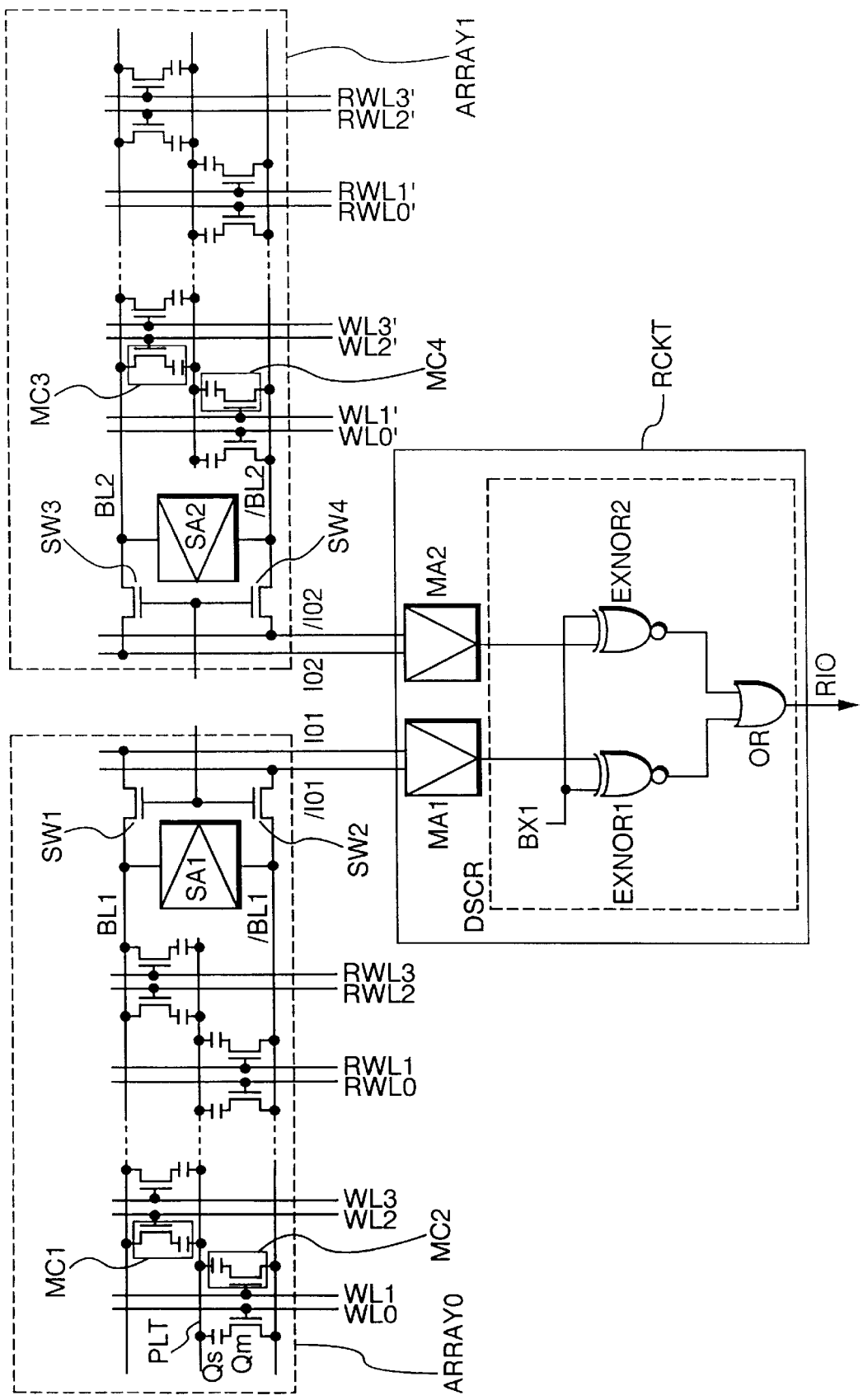
FIG. 5(A) is a schematic circuit diagram showing another example of the read circuit of the dynamic RAM shown in FIG. 1.

FIG. 5(A) is a schematic circuit diagram of another example of the read system circuit. A data conversion circuit DSCR and first and second main amplifiers are included in a read circuit RCKT. The present example is different in memory array configuration from the example shown in FIG. 4. Namely, a memory array ARRAY0 (ARRAY1) includes memory cells provided at points of intersection of one bit line /BL and word lines WL0 and WL1 (WL0' and WL1'), of points of intersection of bit lines BL and /BL on the non-inversion and inversion sides and word lines WL0 through WL3 (WL0' through WL3') and memory cells provided at points of intersection of the other bit line BL and word lines WL2 and WL3 (WL2' and WL3'). Subsequently, memory cells are successively provided in accordance with such a rule. Similarly, spare memory cells are provided in accordance with this rule in the same manner as described above even in the case of redundant word lines RWL0 through RWL3 (RW0' through RWL3').

In this configuration, the word lines WL0 and WL1 are selected if an address signal BX1 is of a logic 0, so that memory cells connected to the bit line /BL,on the inversion side,are specified. If the address signal BX1 is a logic 1, then the word lines WL2 and WL3 are selected so that memory cells connected to the bit line BL,on the non-inversion side,are specified. Consequently, exclusive NOR circuits EXNOR1 and EXNOR2 in the data conversion circuit DSCR are controlled using such an address signal BX1. Namely, when the address signal BX1 is of the logic 0, the exclusive NOR circuits EXNOR1 and EXNOR2 respectively invert signals read from the memory cells connected to the bit line /BL on the inversion side. On the other hand, when the address signal BX1 is of the logic 1, the exclusive NOR circuits EXNOR1 and EXNOR2 respectively send signals read from the memory cells connected to the bit line BL on the non-inversion side as they are.

Although not shown in the same drawing, a write system data conversion circuit is composed of circuits similar to the exclusive NOR circuits EXNOR1 and EXNOR2 controlled based on the address signal BX1. The data conversion circuit performs conversion on data about write signals in the above-described manner and transmits the converted data to input/output lines IO and /IO associated with the memory arrays ARRAY0 and ARRAY1.

The operation of the circuit shown in FIG. 5(A) will be described in detail below.

There are shown in FIG. 5(A), a first memory array (ARRAY0) which comprises a first complementary data line pair including a first word line (WL2), a second word line (WL1), a first data line (BL1) and a second data line (/BL1); a first memory cell (MC1) provided so as to correspond to a point of intersection of the first word line (WL2) and the first data line (BL1); a second memory cell (MC2) provided so as to correspond to a point of intersection of the second word line (WL1) and the second data line (/BL1); a first sense amplifier (SA1) electrically connected to the first data line (BL1) and the second data line (/BL1); a first common complementary data line pair including a first common data line (IO1) and a second common data line (/IO1); a first switch (SW1) electrically connected between the first data line (BL1) and the first common data line (IO1); and a second switch (SW2) electrically connected between the second data line (/BL1) and the second common data line (/IO1), a second memory array (ARRAY1) which comprises a second complementary data line pair including a third word line (WL2'), a fourth word line (WL1'), a third data line (BL2) and a fourth data line (/BL2); a third memory cell (MC3) provided so as to correspond to a point of intersection of the third word line (WL2') and the third data line (BL2); a fourth memory cell (MC4) provided so as to correspond to a point of intersection of the fourth word line (WL1') and the fourth data line (/BL2); a second sense amplifier (SA2) electrically connected to the third data line (BL2) and the fourth data line (/BL2); a second common complementary data line pair including a third common data line (IO2) and a fourth common data line (/IO2); a third switch (SW3) electrically connected between the third data line (BL2) and the third common data line (IO2); and a fourth switch (SW4) electrically-connected between the fourth data line (/BL2) and the fourth common data line (/IO2), and a read circuit (composed of MA1, MA2, ENOR1, ENOR2 and OR) electrically connected to the first common complementary data line pair (IO1 and /IO1) and the second common complementary data line pair (IO2 and /IO2) so as to output a read signal (RIO) therefrom.

Each of the first memory cell (MC1), second memory cell (MC2), third memory cell (MC3) and fourth memory cell (MC4) is of a dynamic memory cell which has an address selection MOSFET and an information storage capacitor coupled thereto and which has an information holding capability which is volatile.

The word lines (WL0, WL1, . . . ) of the first memory array correspond to the word lines (WL0', WL1', . . . ) of the second memory array. Upon writing and reading, one word line (WLi) of the first memory array and one word line (WLi') corresponding thereto of the second memory array are simultaneously selected. For example, the first word line (WL2) and the third word line (WL2') are simultaneously brought to a selection level (high level), whereas the second word line (WL1) and the fourth word line (WL1') are simultaneously brought to the selection level. In other words, the same address is assigned to the first word line (WL2) and the third word line (WL2') and the same address is assigned to the second word line (WL1) and the fourth word line (WL1').

When memory cells connected to the first data line (BL1) and the third data line (BL2) are selected, an address signal BX1 is brought to a high level (logic 1). When memory cells connected to the second data line (/BL1) and the fourth data line (/BL2) are selected, the address signal BX1 is brought to a low level (logic 0). When the first common data line (IO1) is rendered high (low) in level and the second common data line (/IO1) is rendered low (high) in level, the first main amplifier (MA1) outputs a high (low) level signal therefrom. When the third common data line (IO2) is brought to a high (low) level and the fourth common data line (/IO2) is brought to a low (high) level, the second main amplifier (MA2) outputs a high (low) level signal therefrom.

Where read data sent from the first memory cell (MC1) to the first common data line (IO1) is a high level and read data sent from the third memory cell (MC3) to the third common data line (IO2) is a high level when the address signal BX1 is brought to the high level (logic 1) and the first word line (WL2) and the third word line (WL2') are brought to the selection level, the read signal (RIO) is set to a first voltage (high level).

Where the read data sent from the first memory cell (MC1) to the first common data line (IO1) is high in level and the read data sent from the third memory cell (MC3) to the third common data line (IO2) is low in level when the address signal BX1 is brought to the high level (logic 1) and the first word line (WL2) and the third word line (WL2') are brought to the selection level, the read signal (RIO) is set to the first voltage (high level).

Where the read data sent from the first memory cell (MC1) to the first common data line (IO1) is low in level and the read data sent from the third memory cell (MC3) to the third common data line (I02) is high in level when the address signal BX1 is brought to the high level (logic 1) and the first word line (WL2) and the third word line (WL2') are brought to the selection level, the read signal (RIO) is set to the first voltage (high level).

Where the read data sent from the first memory cell (MC1) to the first common data line (IO1) is low in level and the read data sent from the third memory cell (MC3) to the third common data line (IO2) is low in level when the address signal BX1 is brought to the high level (logic 1) and the first word line (WL2) and the third word line (WL2') are brought to the selection level, the read signal (RIO) is set to a second voltage (low level).

Where read data sent from the second memory cell (MC2) to the second common data line (/IO1) is high in level and read data sent from the fourth memory cell (MC4) to the fourth common data line (/IO2) is high in level when the address signal BX1 is brought to a low level (logic 0) and the second word line (WL1) and the fourth word line (WL1') are brought to a selection level, the read signal (RIO) is set to the first voltage (high level).

Where the read data sent from the second memory cell (MC2) to the second common data line (/IO1) is high in level and the read data sent from the fourth memory cell (MC4) to the fourth common data line (/IO2) is low in level when the address signal BX1 is brought to the low level (logic 0) and the second word line (WL1) and the fourth word line (WL1') are brought to the selection level, the read signal (RIO) is set to the first voltage (high level).

Where the read data sent from the second memory cell (MC2) to the second common data line (/IO1) is low in level and the read data sent from the fourth memory cell (MC4) to the fourth common data line (/IO2) is high in level when the address signal BX1 is brought to the low level (logic 0) and the second word line (WL1) and the fourth word line (WL1') are brought to the selection level, the read signal (RIO) is set to the first voltage (high level).

Where the read data sent from the second memory cell (MC2) to the second common data line (/IO1) is low in level and the read data sent from the fourth memory cell (MC4) to the fourth common data line (/IO2) is low in level when the address signal BX1 is brought to the low level (logic 0) and the second word line (WL1) and the fourth word line (WL1') are brought to the selection level, the read signal (RIO) is set to the second voltage (low level).

Figure 5B:
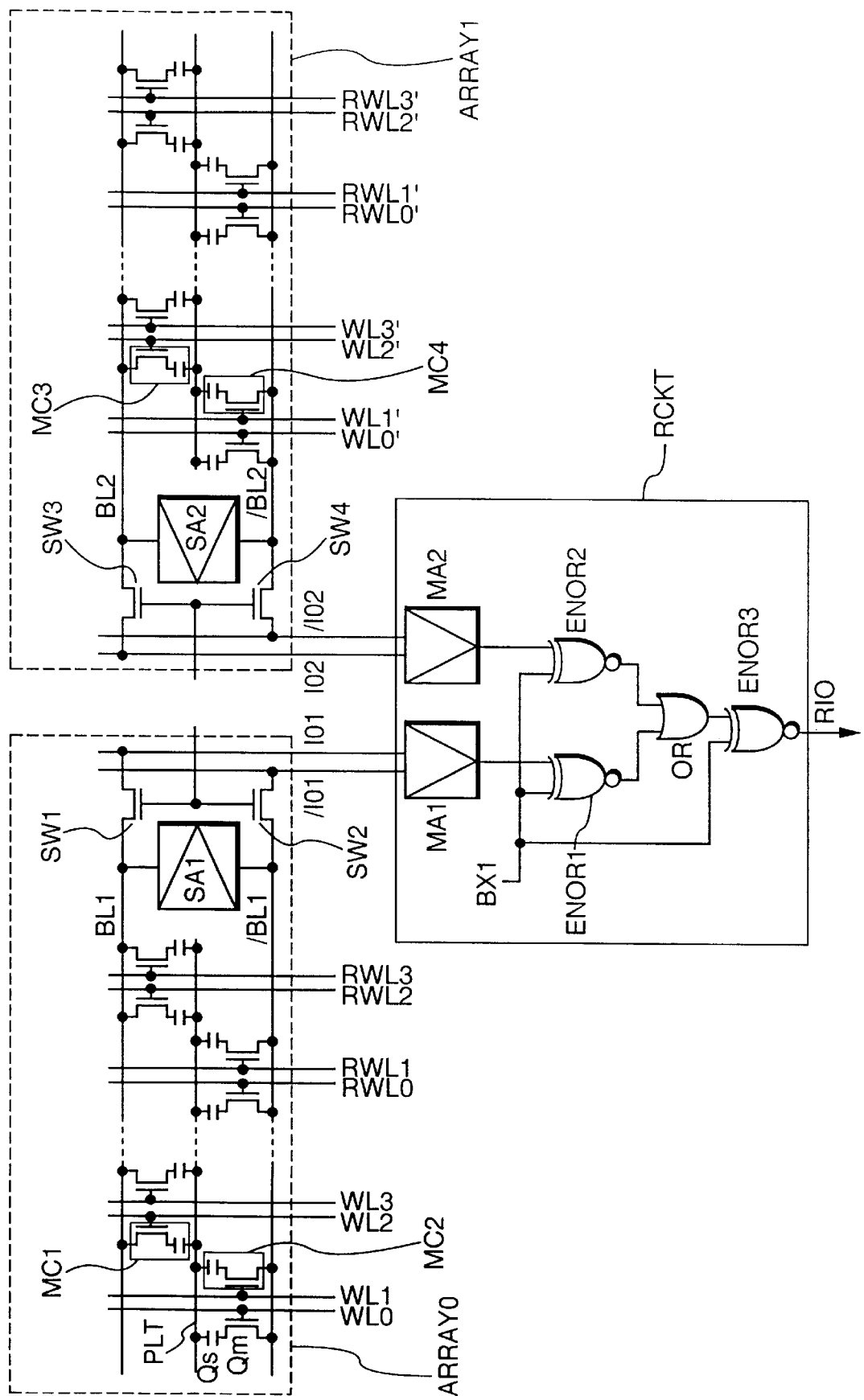
FIG. 5(B) is a schematic circuit diagram illustrating a further example of the read circuit of the dynamic RAM shown in FIG. 1.

Further, FIG. 5(B) is a schematic circuit diagram of a further example of the read circuit. The operation of the read circuit shown in FIG. 5(B) will now be described in detail below.

There are shown in FIG. 5(B), a first memory array (ARRAY0) which comprises a first complementary data line pair including a first word line (WL2), a second word line (WL1), a first data line (BL1) and a second data line (/BL1); a first memory cell (MC1) provided so as to correspond to a point of intersection of the first word line (WL2) and the first data line (BL1); a second memory cell (MC2) provided so as to correspond to a point of intersection of the second word line (WL1) and the second data line (/BL1); a first sense amplifier (SA1) electrically connected to the first data line (BL1) and the second data line (/BL1); a first common complementary data line pair including a first common data line (IO1) and a second common data line (/IO1); a first switch (SW1) electrically connected between the first data line (BL1) and the first common data line (IO1); and a second switch (SW2) electrically connected between the second data line (/BL1) and the second common data line (/IO1), a second memory array (ARRAY1) which comprises a second complementary data line pair including a third word line (WL2'), a fourth word line (WL1'), a third data line (BL2) and a fourth data line (/BL2); a third memory cell (MC3) provided so as to correspond to a point of intersection of the third word line (WL2') and the third data line (BL2); a fourth memory cell (MC4) provided so as to correspond to a point of intersection of the fourth word line (WL1') and the fourth data line (/BL2); a second sense amplifier (SA2) electrically connected to the third data line (BL2) and the fourth data line (/BL2); a second common complementary data line pair including a third common data line (IO2) and a fourth common data line (/IO2); a third switch (SW3) electrically connected between the third data line (BL2) and the third common data line (IO2); and a fourth switch (SW4) electrically connected between the fourth data line (/BL2) and the fourth common data line (/IO2), and a read circuit (composed of MA1, MA2, ENOR1, ENOR2, ENOR3 and OR) electrically connected to the first common complementary data line pair (IO1 and /IO1) and the second common complementary data line pair (IO2 and /IO2) so as to output a read signal (RIO) therefrom.

Each of the first memory cell (MC1), second memory cell (MC2), third memory cell (MC3) and fourth memory cell (MC4) is of a dynamic memory cell which has an address selection MOSFET and an information storage capacitor coupled thereto and which has an information holding capability which is volatile.

The word lines (WL0, WL1, . . . ) of the first memory array correspond to the word lines (WL0', WL1', . . . ) of the second memory array. Upon writing and reading, one word line (WLi) of the first memory array and one word line (WLi') corresponding thereto of the second memory array are simultaneously selected. For example, the first word line (WL2) and the third word line (WL2') are simultaneously brought to a selection level (high level), whereas the second word line (WL1) and the fourth word line (WL1') are simultaneously brought to the selection level. In other words, the same address is assigned to the first word line (WL2) and the third word line (WL2') and the same address is assigned to the second word line (WL1) and the fourth word line (WL1').

When memory cells connected to the first data line (BL1) and the third data line (BL2) are selected, an address signal BX1 is brought to a high level (logic 1). When memory cells connected to the second data line (/BL1) and the fourth data line (/BL2) are selected, the address signal BX1 is brought to a low level (logic 0). When the first common data line (IO1) is rendered high (low) in level and the second common data line (/IO1) is rendered low (high) in level, the first main amplifier (MA1) outputs a signal high (low) in level therefrom. When the third common data line (IO2) is brought to a high (low) level and the fourth common data line (/IO2) is brought to a low (high) level, the second main amplifier (MA2) outputs a high (low) level signal therefrom.

Where read data transmitted from the first memory cell (MC1) to the first common data line (IO1) is a high level and read data sent from the third memory cell (MC3) to the third common data line (IO2) is a high level when the address signal BX1 is brought to the high level (logic 1) and the first word line (WL2) and the third word line (WL2') are brought to the selection level, the read signal (RIO) is set to a first voltage (high level).

Where the read data transmitted from the first memory cell (MC1) to the first common data line (IO1) is high in level and the read data sent from the third memory cell (MC3) to the third common data line (IO2) is low in level when the address signal BX1 is brought to the high level (logic 1) and the first word line (WL2) and the third word line (WL2') are brought to the selection level, the read signal (RIO) is set to the first voltage (high level).

Where the read data transmitted from the first memory cell (MC1) to the first common data line (IO1) is low in level and the read data sent from the third memory cell (MC3) to the third common data line (IO2) is high in level when the address signal BX1 is brought to the high level (logic 1) and the first word line (WL2) and the third word line (WL2') are brought to the selection level, the read signal (RIO) is set to the first voltage (high level).

Where the read data transmitted from the first memory cell (MC1) to the first common data line (IO1) is low in level and the read data sent from the third memory cell (MC3) to the third common data line (IO2) is low in level when the address signal BX1 is brought to the high level (logic 1) and the first word line (WL2) and the third word line (WL2') are brought to the selection level, the read signal (RIO) is set to a second voltage (low level).

Where read data transmitted from the second memory cell (MC2) to the second common data line (/IO1) is high in level and read data sent from the fourth memory cell (MC4) to the fourth common data line (/IO2) is high in level when the address signal BX1 is brought to a low level (logic 0) and the second word line (WL1) and the fourth word line (WL1') are brought to the selection level, the read signal (RIO) is set to the second voltage (low level).

Where the read data transmitted from the second memory cell (MC2) to the second common data line (/IO1) is high in level and the read data sent from the fourth memory cell (MC4) to the fourth common data line (/IO2) is low in level when the address signal BX1 is brought to the low level (logic 0) and the second word line (WL1) and the fourth word line (WL1') are brought to the selection level, the read signal (RIO) is set to the second voltage (low level).

Where the read data transmitted from the second memory cell (MC2) to the second common data line (/IO1) is low in level and the read data sent from the fourth memory cell (MC4) to the fourth common data line (/IO2) is high in level when the address signal BX1 is brought to the low level (logic 0) and the second word line (WL1) and the fourth word line (WL1') are brought to the selection level, the read signal (RIO) is set to the second voltage (low level).

Where the read data transmitted from the second memory cell (MC2) to the second common data line (/IO1) is low in level and the read data sent from the fourth memory cell (MC4) to the fourth common data line (/IO2) is low in level when the address signal BX1 is brought to the low level (logic 0) and the second word line (WL1) and the fourth word line (WL1') are brought to the selection level, the read signal (RIO) is set to the first voltage (high level).

Figure 6:
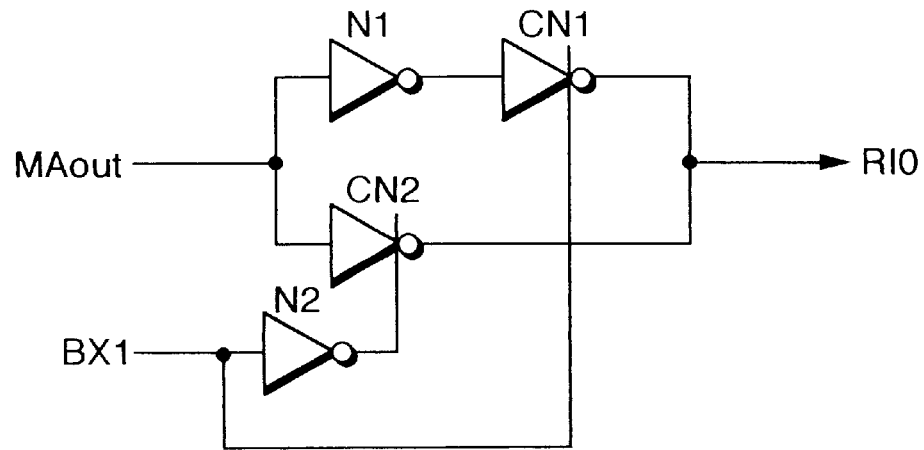
FIG. 6 is a circuit diagram showing one example of an exclusive NOR circuit employed in a data conversion circuit shown in FIG. 5.

FIG. 6 is a circuit diagram showing one example of the aforementioned exclusive NOR circuit. In the present example, attention is paid to the operation of the exclusive NOR circuit EXNOR. A locked inverter circuit CN1 is activated in response to the high level (logic 1) of the address signal BX1 as described above so that an output signal MAout from a main amplifier is outputted as a synchronizing signal as it is through an inverter circuit N1 and the clocked inverter circuit CN1 placed in operation. At this time, a clocked inverter circuit CN2 is brought into a non-operating state in response to a low level of a signal output from an inverter circuit N2 supplied with the high level of the address signal BX1 so that the output thereof is brought into a high impedance state.

When the address signal BX1 is of the low level (logic 0), the clocked inverter circuit CN1 is deactivated so that the output thereof is brought into the high impedance state. In response to the low level of the address signal BX1, the signal output from the inverter circuit N2 is brought to a high level to activate the clocked inverter circuit CN2, whereby the output signal MAout of the main amplifier can be inverted and outputted.

Figure 7:
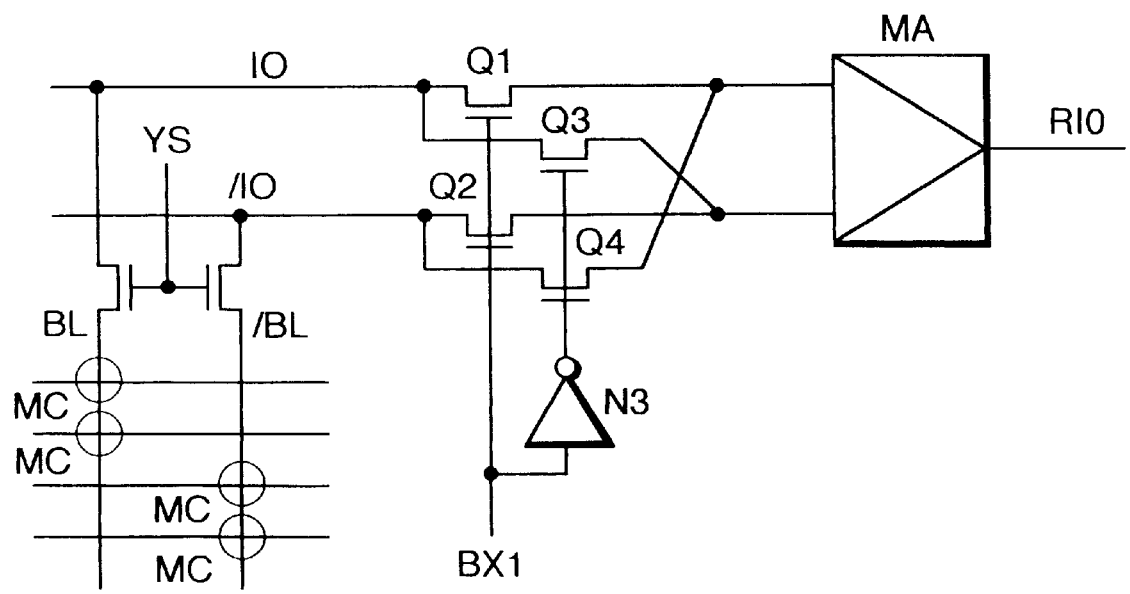
FIG. 7 is a circuit diagram illustrating another example of the data conversion circuit shown in FIG. 5.

FIG. 7 is a circuit diagram showing another example of the data conversion circuit according to the present invention. In the present example, the data conversion circuit is provided for complementary input/output lines IO and /IO on the memory array side. When the word lines WL0 and WL1 are selected from the memory array as shown in FIG. 5, memory cells connected to a bit line /BL on the inversion side are selected. When the word lines WL2 and WL3 are selected, memory cells connected to a bit line BL on the non-inversion side are selected. In this case, a first transmission path, which is composed of transmission gate MOSFETs Q1 and Q2 and allows a signal to pass therethrough as it is, and a second transmission path, which is composed of transmission gate MOSFETs Q3 and Q4 and inverts the signal, are provided between the complementary input/output lines IO and /IO and input terminals (output terminal) of a write amplifier (not shown).

When an address signal BX1 is high in level, the MOSFETs Q1 and Q2, that constitute the aforementioned first transmission path, are turned on so that a read signal produced from each memory cell connected to the bit line BL of the memory array is supplied to its corresponding input terminal of the main amplifier MA as it is. When the address signal BX1 is low in level, the MOSFETs Q3 and Q4 that constitute the second transmission path, are turned on so as to bring a signal output from an inverter circuit N3 to a high level. Owing to the turning on of the MOSFETs Q3 and Q4 that forms the second transmission path, a complementary read signal produced from each memory cell connected to the bit line /BL of the memory array is inverted and transmitted to its corresponding input terminal of the main amplifier MA.

The first and second transmission paths are also used for a data conversion operation of a write system. Namely, when the MOSFETs Qi and Q2 that constitute the first transmission path, are brought into the on state at the high level of the address signal BX1 so as to transmit a write signal to its corresponding memory cell connected to the bit line BL of the memory array, an output signal from the unillustrated write amplifier is sent to the input/output lines IO and /IO as it is. On the other hand, when the MOSFETs Q3 and Q4 that constitute the second transmission path, are brought to the on state at the low level of the address signal BX1 so as to transmit a write signal to its corresponding memory cell connected to the bit line /BL of the memory array, the signal output from the unillustrated write amplifier is inverted and sent to the input/output lines IO and /IO.

It is desirable that if it is necessary to respectively set high and low levels of the write signal sent to the input/output lines IO and /IO to a high level corresponding to a source voltage Vcc and a low level corresponding to a circuit ground potential, then CMOS switches composed of N channel MOSFETs and P channel MOSFETs connected in parallel are used as the MOSFET switches Q1 through Q4. Since high and low levels amplified by a sense amplifier are transmitted as high and low levels to be actually written into a memory cell, the high and low levels of the write signal transmitted to the input/output lines IO and /IO may be levels necessary to invert the sense amplifier.

Figure 8:
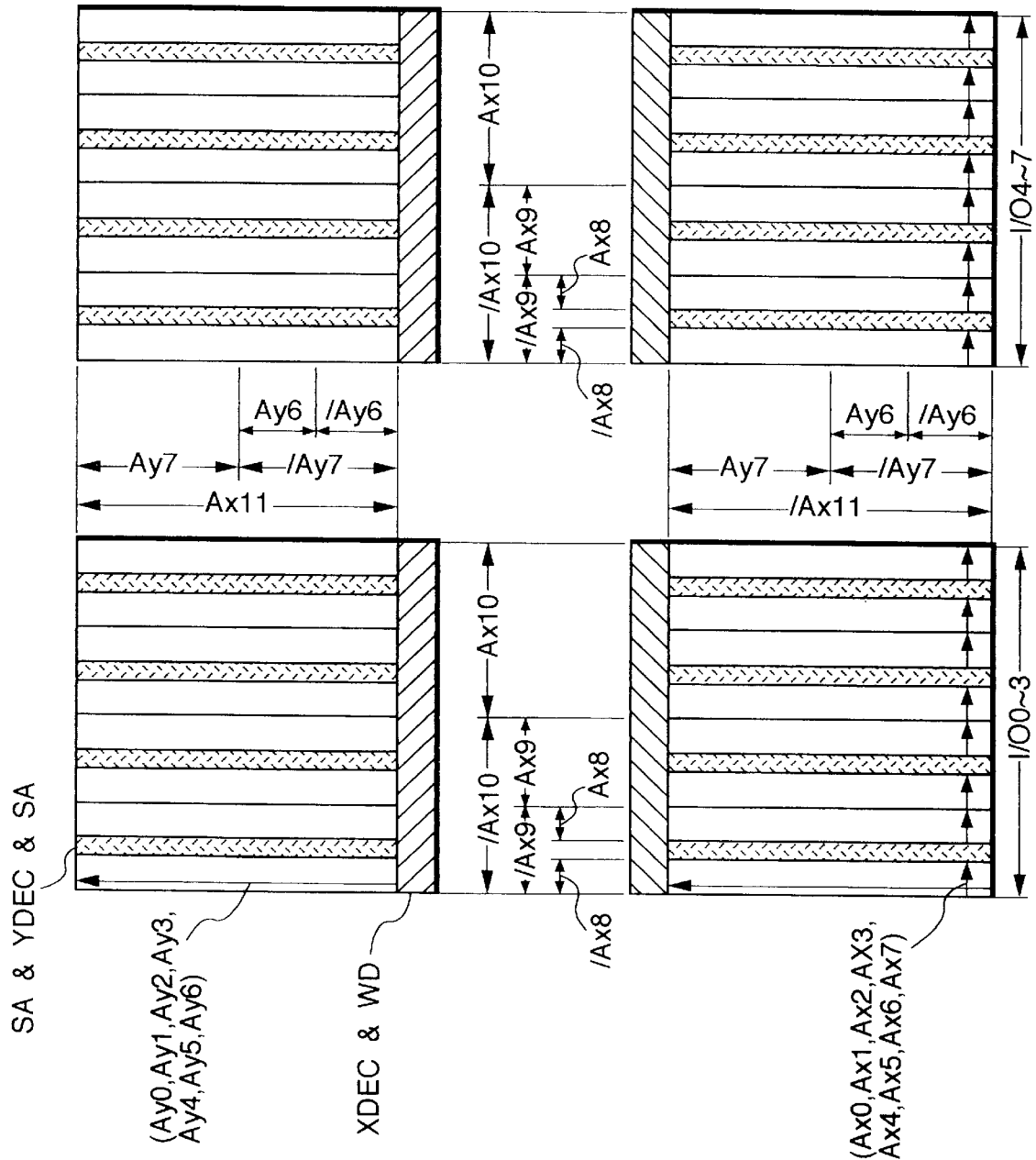
FIG. 8 is a layout diagram of memory arrays employed in one embodiment of the dynamic RAM to which the present invention is applied.

FIG. 8 is a layout diagram of memory arrays employed in one embodiment of a dynamic RAM to which the present invention is applied. The dynamic RAM according to the present embodiment is not particularly limited but has a storage capacity of about 8 Mbits.

The whole chip is divided into two corresponding to the left and right portions. The left and right portions are divided according to the most significant addresses X11 and /X11 of X addresses. Further, the whole chip is divided into two upper and lower portions. The upper half is associated with four bits of data terminals I/O4 through I/O7, whereas the lower half is associated with four bits of data terminals I/O0 through I/O3. The arrays divided into the four as described above are associated with the arrays ARRAY0 through ARRAY3 shown in FIG. 1. Eight memory mats MMATs in one array are specified by addresses AX8 through AX10 of the three leftmost bits.

Arrows marked on the memory mats show the direction in which the addresses advance. In the same drawing, refresh is successively effected on the two arrays of the right half in 2048 cycles (256×8). The normal self-refresh using the signal φSELF is successively performed on the two memory arrays of the left half in a cycle ranging from 2049 to 4096 cycles. On the other hand, since the most significant addresses AX11 and /AX11 are both brought to a selection level (degenerated) under the low power refresh based on the signal φLSELF referred to above and word lines are simultaneously selected from the two arrays on the left and right sides, the refresh operation is terminated in the 2048 cycles.

Namely, one memory mat has 256 word lines. One of the 256 word lines is selected in accordance with 8 bits composed of address signals AX0 through AX7. On the other hand, four pairs of bit lines are selected from pairs of 256×4 bit lines in accordance with column addresses AY0 through AY7.

Correspondence diagrams showing the layouts of external and internal addresses are respectively illustrated in FIGS. 23 and 24 in an easy style. In this way, the dynamic RAM according to the present embodiment is called an address non-multi type based on a so-called static RAM. AX are assigned to internal addresses for principally selecting word lines, whereas AY are assigned to internal addresses for principally selecting bit lines. It is needless to say that the dynamic RAM may be one for inputting an address signal in accordance with an address multi system as in the case of the conventional dynamic RAM.

FIG. 25 shows the relationship among the arrays ARRAY, memory arrays MARY shown in FIG. 1 and their corresponding addresses /AX11 and AX11, main amplifiers MA and write drivers WD.

Arrows marked on each memory mat indicate the directions of the addresses. Namely, the arrays are successively refreshed from top to bottom as seen in the same drawing. The refresh cycle reaches 8192 cycles when they are successively refreshed in the direction indicated by arrow in the same drawing and hence a memory access is restricted. Therefore, four memory mats specified by an address X12, for example, are simultaneously selected so as to be simultaneously refreshed as described above, whereby the refresh on all arrays is terminated in 4096 (about 4K) cycles.

Figure 9A:
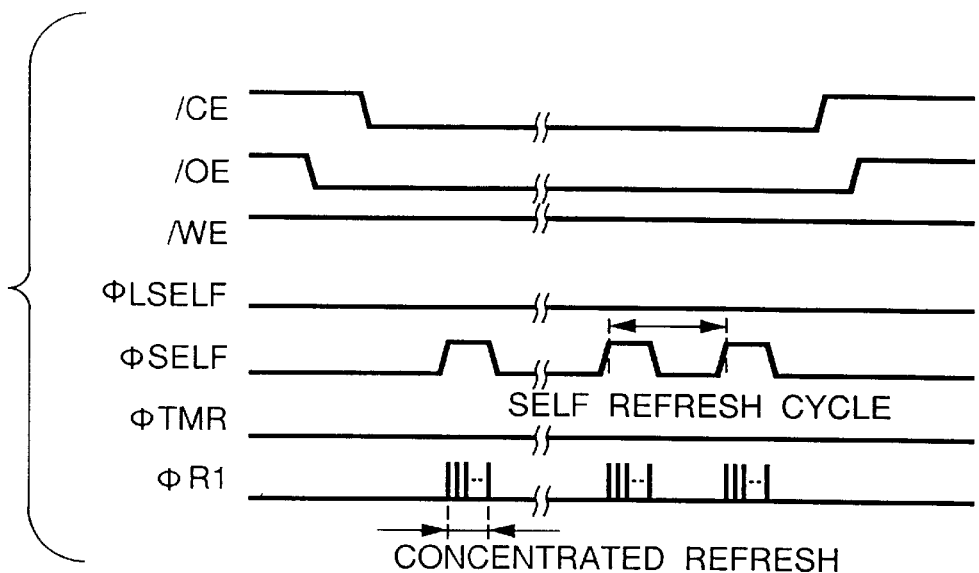
FIGS. 9(A) and 9(B) are respectively schematic timing charts for describing refresh operations of the dynamic RAM according to the present invention.
Figure 9B:
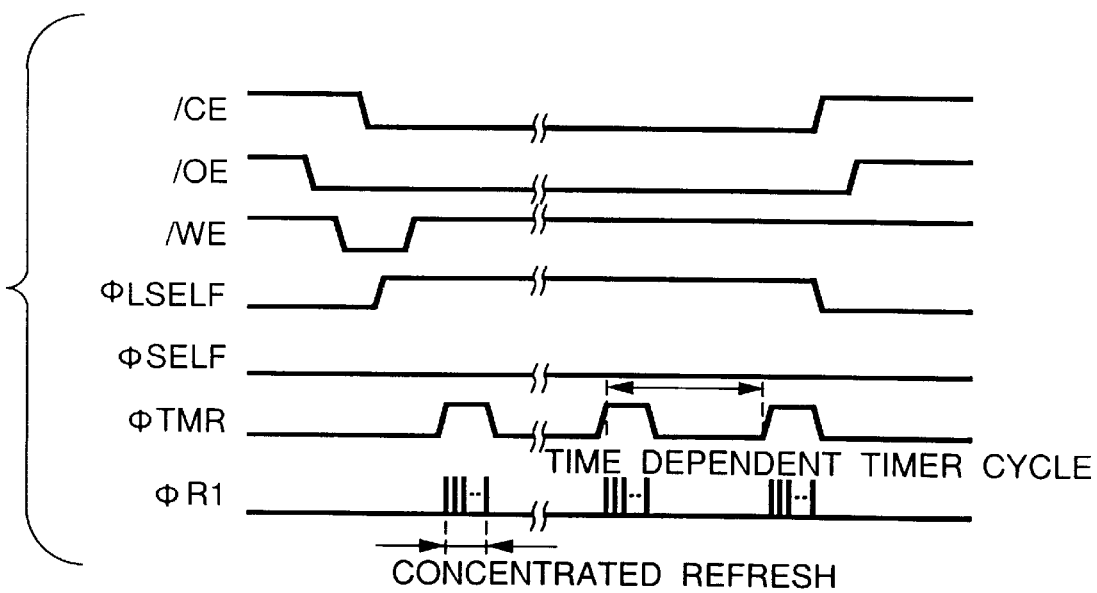

FIGS. 9(A) and 9(B) respectively show schematic timing charts for describing refresh operations of the dynamic RAM according to the present invention. FIG. 9(A) illustrates a normal refresh operation and FIG. 9(B) shows a low power refresh operation proposed by the present invention.

Although there is no particular restraint on FIG. 9(A), fixed timer cyclic or periodic refresh is executed. This refresh mode is started by setting an output enable signal /OE to a low level prior to the setting of a chip enable signal /CE to a low level. That is, the chip enable signal /CE is rendered low in level after the output enable signal /OE has been brought to the low level. When this state continues for a predetermined period or more, a signal φSELF is generated. During a period in which the self-refresh signal φSELF is high in level, a row-system main clock φR1 is generated by a built-in timer circuit. Thus, the operation for selecting a word line, the operation for reading a signal from a memory cell under the activation of a sense amplifier and amplifying it, and a refresh operation of re-writing of the amplified signal into the memory cell are executed.

One cycle or period of the refresh signal φSELF, i.e., a refresh time required to refresh all the memory cells in the dynamic RAM, is set by a ROM or the like using a polysilicon fuse or the like not so as to exceed the minimum data holding time of each memory cell of such a dynamic RAM, which is likely to fall behind as described above. Although no restriction is given in particular, a self-refresh period of a signal φR1, which includes concentrated refresh made in 4096 cycles, is set not so as to exceed the minimum data holding time as described above. Incidentally, the address signals AX11 and /AX11 may be invalidated so that the refresh is done in 2048 cycles.

Although there is no particular restraint on FIG. 9(B), temperature-dependent timer cyclic or periodic refresh is executed. This refresh mode is started by setting an output enable signal /OE and a write enable signal /WE to a low level prior to the setting of a chip enable signal /CE to a low level. That is, the chip enable signal /CE is rendered low in level after the output enable signal /OE and the write enable signal /WE have been brought to the low level. When this state continues for a predetermined period or more, a signal φLSELF is generated. During a period in which the self-refresh signal φLSELF is high in level, a row-system main clock φR1 is generated by a built-in temperature-dependent timer circuit. Thus, the operation for selecting a word line, the operation for reading a signal from a memory cell under the activation of a sense amplifier and amplifying it, and a refresh operation of re-writing of the amplified signal into the memory cell are executed.

One cycle or period of the refresh signal φLSELF, i.e., a refresh time required to refresh all the memory cells in the dynamic RAM, is set by the temperature-dependent timer circuit,to be described later,not so as to exceed an average data holding time of a memory cell of such a dynamic RAM. In this case, the address signals AX11 and /AX11 are invalidated so that the concentrated refresh is done in the 2048 cycles. Prior to the refresh mode, the same data is held in two memory cells simultaneously selected from two memory arrays divided by the address signals AX11 and /AX11.

Figure 10:
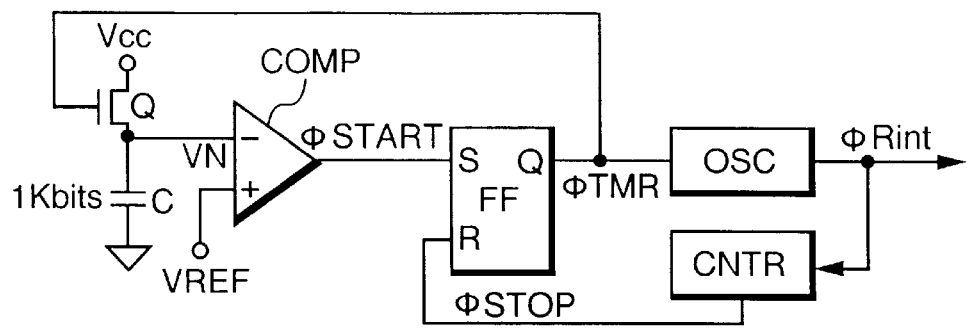
FIG. 10 is a schematic block diagram showing one example of a temperature-dependent timer.

FIG. 10 is a schematic block diagram showing one example of the temperature-dependent timer. Although there is no particular restraint on a capacitor C, the temperature-dependent timer is constructed in such a way that capacitors of 1024 memory cells are electrically connected in parallel. When a conductor trace or wire corresponding to a word line connected with the gate of each of MOSFETs Qm for address selection, which constitute memory cells, is electrically connected to a ground potential in a circuit, the MOSFET Qm for address selection is steadily brought into an off state. A MOSFET Q is a switch MOSFET for precharging the capacitor C and consists of a MOSFET different from the address selection switch MOSFET. The address selection switch MOSFET may be used as an alternative to this.

A voltage held by the capacitor C is supplied to an inversion input—of a voltage comparison circuit COMP. A reference voltage VREF is applied to a non-inversion input+ of the voltage comparison circuit COMP. A signal φSTART outputted from the voltage comparison circuit COMP is supplied to a set input S of a flip-flop circuit FF. A pulse φTMR outputted from an output Q of the flip-flop circuit FF is supplied to the gate of the switch MOSFET Q, on the one hand,and is input to an oscillator circuit OSC, on the other hand,to control the effectiveness and/or ineffectiveness of an oscillating operation. When the oscillating operation of the oscillator circuit OSC is made effective, the oscillator circuit OSC generates oscillations to form an oscillating pulse φRint. The pulse φRint is supplied to the timing control circuit TG from which the row-system main clock φR1 is generated.

The pulse φRint is supplied to a counter circuit CNTR. When the counter circuit CNTR counts 4096 or 2048, the counter circuit CNTR generates a termination signal φSTOP therefrom. An address counter for forming a refresh address may be used as an alternative to the counter circuit CNTR. In response to the termination signal φSTOP, the flip-flop circuit FF is reset so that the switch MOSFET Q is turned off and the timer circuit TIMER is deactivated.

Figure 11:
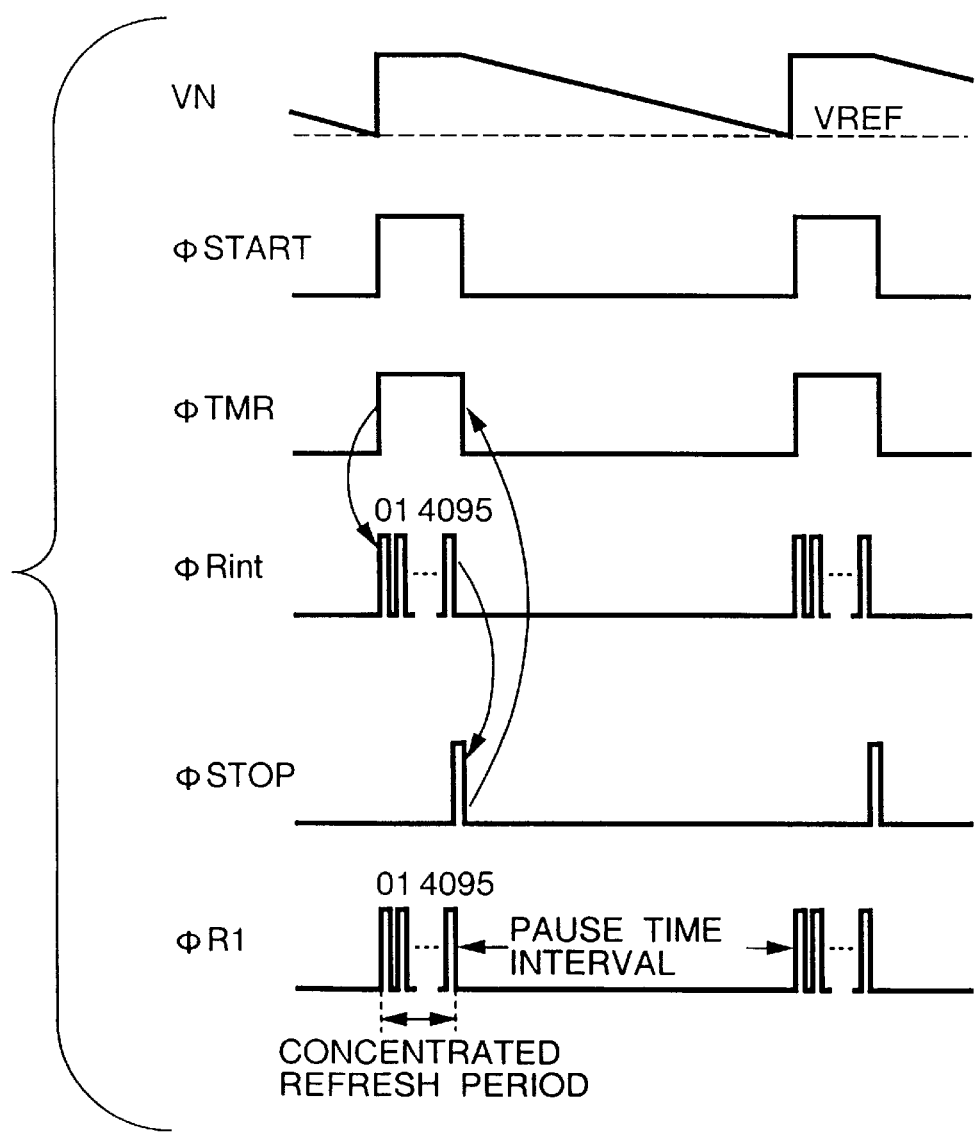
FIG. 11 is a timing chart for describing the operation of the temperature-dependent timer shown in FIG. 10.

FIG. 11 is a timing chart for describing the operation of the temperature-dependent timer. When the voltage held by the capacitor C reaches the reference voltage VREF, the voltage comparison circuit COMP brings the output signal φSTART to a high level. Thus, the flip-flop circuit FF is set so that the output pulse φTMR is brought to a high level so as to turn on the switch MOSFET Q, whereby the precharge of the capacitor C is started. In conjunction with this operation, the timer circuit TIMER starts oscillating to generate a row-system main clock signal φR1 and a pulse φRC to be supplied to a refresh control circuit RFC, whereby concentrated refresh is started based on a row-system selecting operation and a refresh address stepping operation.

The row-system main clock signal φR1 is formed 4096 times or cycles (corresponding to counted values 4095) so as to correspond to the pulse φRint generated from the oscillator circuit OSC so that 4096 word lines are successively selected. When refresh operations of memory cells selected for such word lines are completed, the termination signal φSTOP is generated from the counter circuit CNTR. As a result, the flip-flop circuit FF is reset to turn off the switch MOSFET Q, so that the precharge operation of the capacitor C is terminated. Thus, the capacitor C holds a precharged voltage VN therein and the timer circuit TIMER stops oscillating so as to enter into a pause period or time interval. The pause period corresponds to the time between a reduction in holding voltage VN of the capacitor C due to the leakage current and the attainment to the reference voltage VREF. The pause time is of a time interval during which the capacitor C is modeled after each memory cell and which depends on the temperature as described above because a reduction in potential due to the discharge of an electric charge stored in the capacitor C is affected by ambient temperatures and a source voltage. Since about 1024 memory cells are particularly used wherein capacitors thereof are connected in parallel, the average charge holding time of the entire memory cells is held.

Figure 12A:
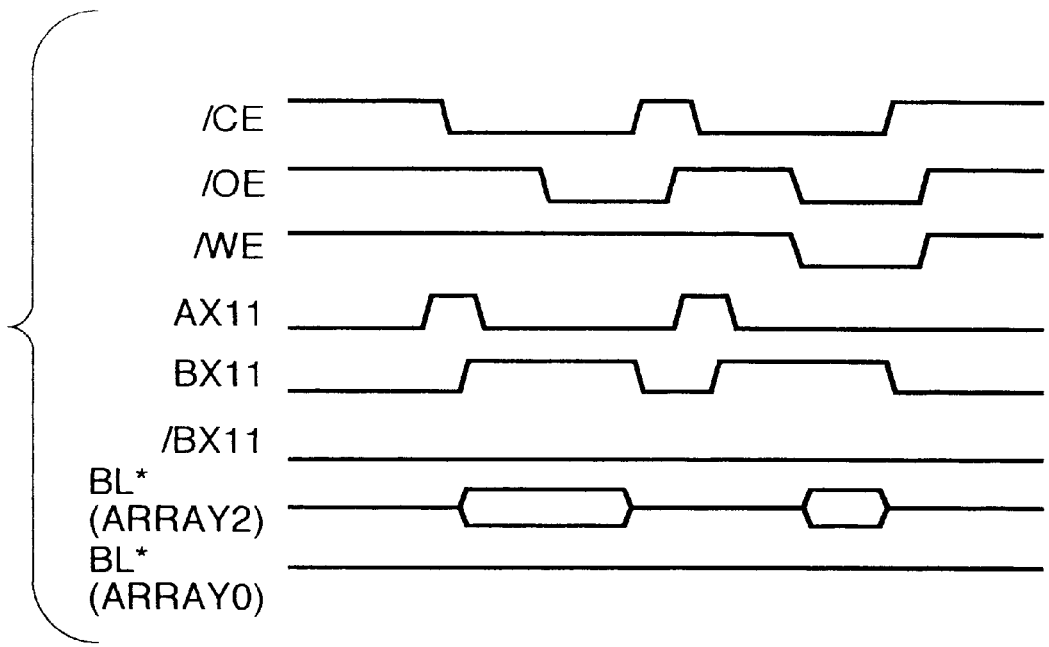
FIGS. 12(A) and 12(B) are respectively schematic timing charts for describing the operation of the dynamic RAM according to the present invention.
Figure 12B:
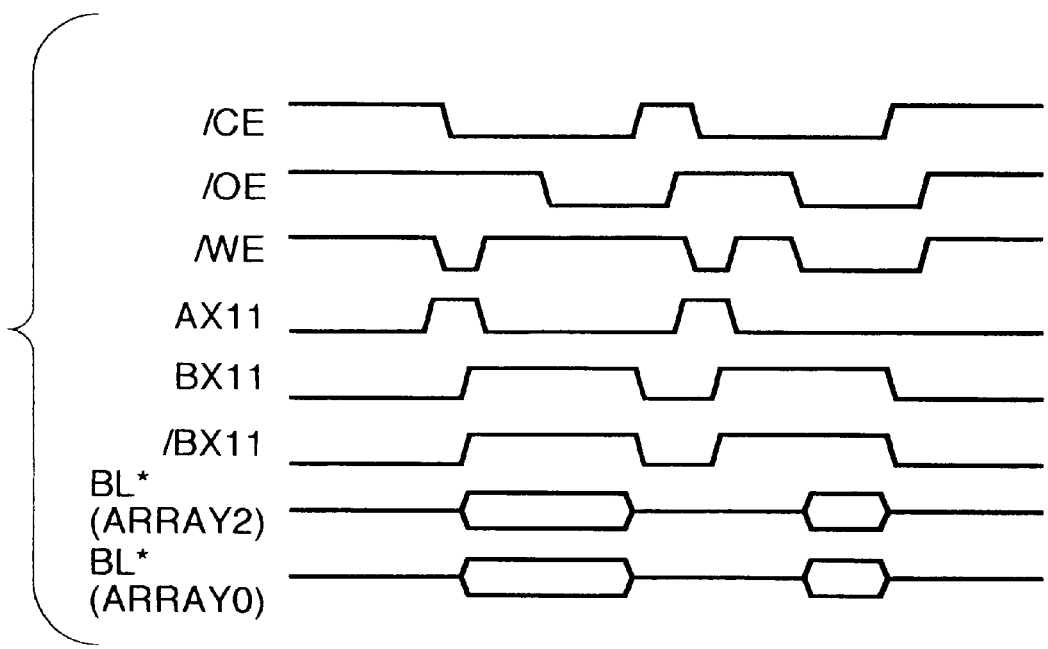

FIGS. 12(A) and 12(B) are respectively schematic timing charts for describing the operation of the dynamic RAM according to the present invention. FIG. 12(A) shows normal read and write operations and FIG. 12(B) illustrates read and write operations under a dual memory cell system.

Referring to FIG. 12(A), a row-system main clock timing signal XR1 is generated where an output enable signal /OE and a write enable signal /WE are high in level when a chip enable signal /CE becomes active (low in level). Word lines specified by an internal address signal AX11 and unillustrated AX0 through AX10 are selected based on the timing signal φR1. Similarly, a bit line pair specified by each of unillustrated internal address signals AY0 through AY7 is selected. If the write enable signal /WE is high in level during a period in which the output enable signal /OE is active (low in level), then data in a memory cell of a designated ARRAY2 is output through its corresponding data terminal I/O. If the write enable signal /WE is low in level during the period in which the output enable signal /OE is active (low in level), then a write signal input from the data terminal I/O is written into the corresponding memory cell of the designated ARRAY2.

Referring to FIG. 12(B), a row-system main clock timing signal φR1 is generated where an output enable signal /OE and a write enable signal /WE are high in level when a chip enable signal /CE becomes active (low in level). Based on the timing signal φR1, an internal address signal AX11 is invalidated so that regions ARRAY2 and ARRAY0 divided into two by the internal address signal AX11 are simultaneously selected. Namely, word lines specified by unillustrated AX0 through AX10 are simultaneously selected from the memory arrays ARRAY2 and ARRAY0. Similarly, a bit line pair specified by each of unillustrated internal address signals AY0 through AY7 is selected.

If the write enable signal /WE is high in level during the period in which the output enable signal /OE is active (low in level), then data in memory cells of the specified ARRAY2 and ARRAY0 are transmitted through OR circuits and are outputted through their corresponding data terminals I/O. If the write enable signal /WE is low in level during the period in which the output enable signal /OE is active (low in level), then a write signal input through the data terminal I/O is simultaneously written into each of the memory cells of the specified ARRAY2 and ARRAY0.

Figure 13A:
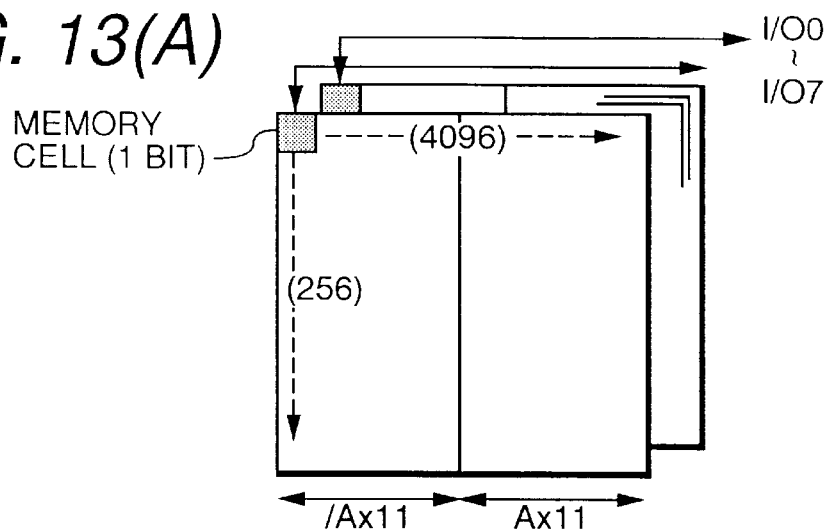
FIGS. 13(A), 13(B) and 13(C) are respectively configurational views schematically showing the operations of the dynamic RAM according to the present invention.
Figure 13B:
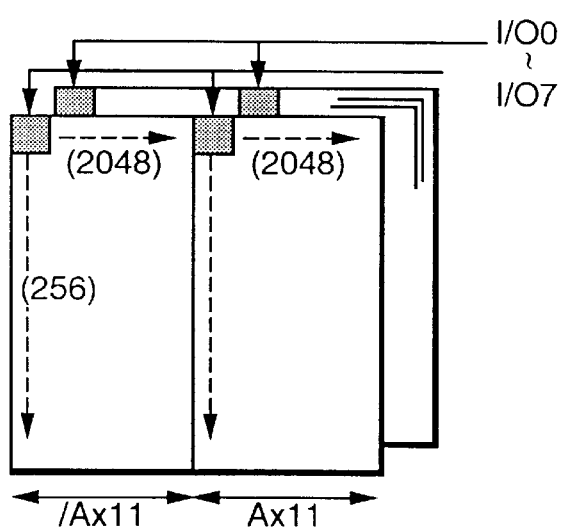
Figure 13C:
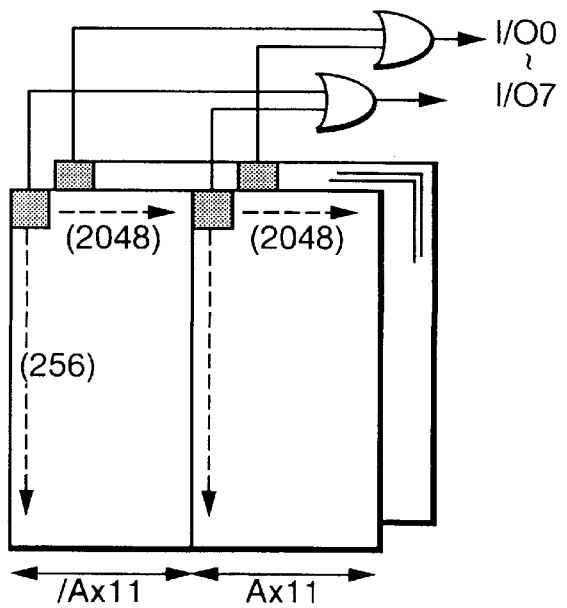

FIGS. 13(A), 13(B) and 13(C) are respectively configurational views schematically illustrating the operations of the dynamic RAM according to the present invention. FIG. 13(A) shows a normal access operation, FIG. 13(B) illustrates a data write operation at the time of a dual memory cell operation, and FIG. 13(C) depicts a data read operation at the time of the dual memory cell operation.

As shown in FIG. 13(A), input/output data terminals I/O0 through I/O7 respectively have address spaces of 4096 (row addresses)×256 (column addresses) upon the normal read and write operations. The read or write operation is effected on them on a random basis.

As shown in FIG. 13(B), internal addresses AX11 and /AX11 are invalidated (and are simultaneously brought to an active level) upon the write operation under the dual memory cell system. Therefore, the input/output data terminals I/O0 through I/O7 respectively have, as two surfaces, address spaces of 2048 (row addresses)×256 (column addresses). The same data is simultaneously written into both surfaces.

As illustrated in FIG. 13(C), internal addresses AX11 and /AX11 are made ineffective (and are simultaneously brought to an active level) in the same manner as described above upon the read operation under the dual memory cell system. Therefore, the input/output data terminals I/O0 through I/O7 respectively have two surfaces each composed of 2048 (row addresses)×256 (column addresses). Data are simultaneously read from both surfaces. These read data, i.e., the respective two data set as pairs on the different surfaces are subjected to an OR operation, followed by being output through the data terminals I/O0 through I/O7.

Figure 14:
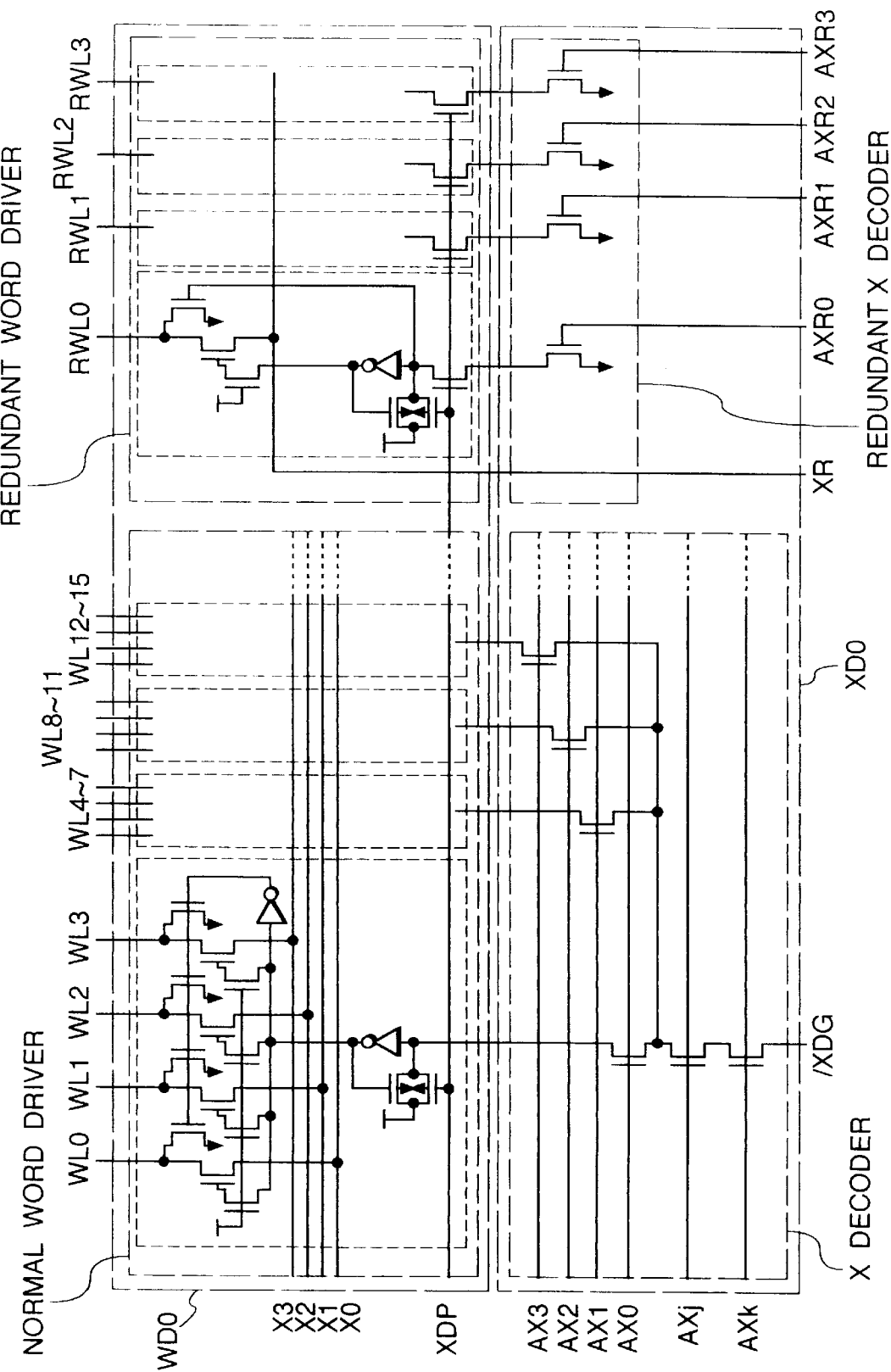
FIG. 14 is a circuit diagram showing examples of X decoders and word drivers employed in the dynamic RAM according to the present invention.

FIG. 14 is a circuit diagram showing examples of X decoders and word drivers employed in the dynamic RAM according to the present invention. When a timing signal /XDG is brought to a low level, an X decoder starts operating. Namely, when each of MOSFET switches specified by predecode signals AXj, AXk and AX0 through AX3 is turned on, an input node of an inverter circuit of the word driver is drawn into a selected state.

The input of a non-selected word driver remains at a precharge high level. A signal outputted from an inverter circuit supplied with the precharge signal is brought to a low level, so that a feedback P channel MOSFET, provided between the input of the inverter circuit and a source voltage, is turned on so as to bring the inverter circuit into a latch state.

One of word lines selection timing signals X0 through X3 is rendered high in level. In four driver MOSFETs each brought into an on condition in response to a high level of the output signal from the aforementioned inverter circuit, the high level of one of the timing signals X0 through X3 is transmitted to one word line as a word line selection signal. Since chargeups are respectively made between the gates of the driver MOSFETs and channels according to the on condition referred to above at this time, the driver MOSFETs are subjected to self-bootstrapping in accordance with the high level of one of the timing signals X0 through X3 so that the high level of the above timing signal is transmitted to the corresponding word line as it is. One redundant X decoder is selected based on a signal AXR0 and a corresponding redundant word line RWL is selected in synchronism with a timing signal XR associated with the timing signals X0 through X3.

Figure 15A:
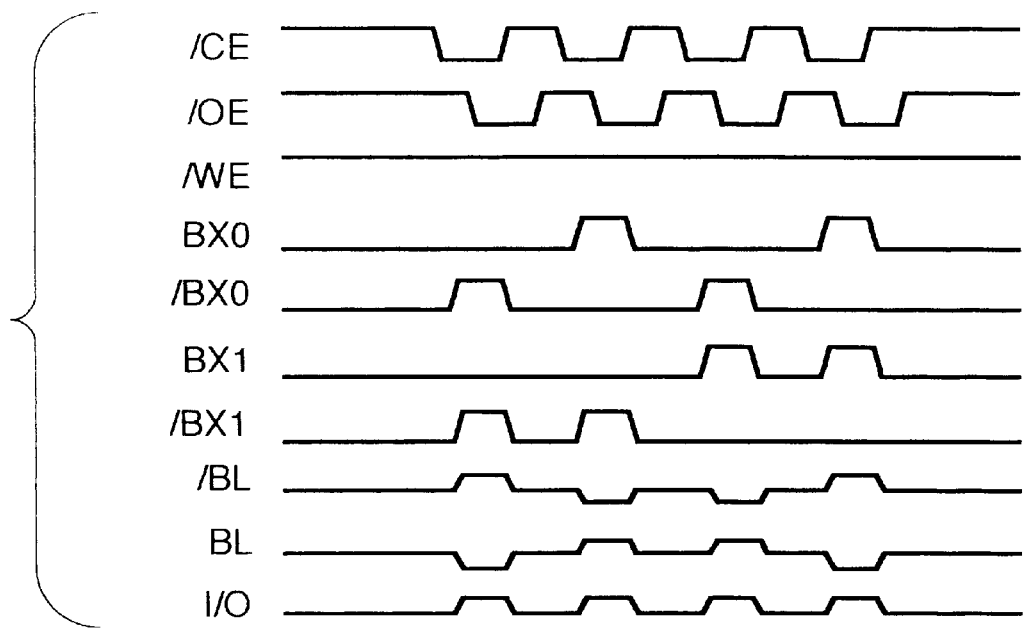
FIGS. 15(A) and 15(B) are respectively timing charts for explaining schematic functions of the data conversion circuit DSCR provided in the dynamic RAM according to the present invention.
Figure 15B:
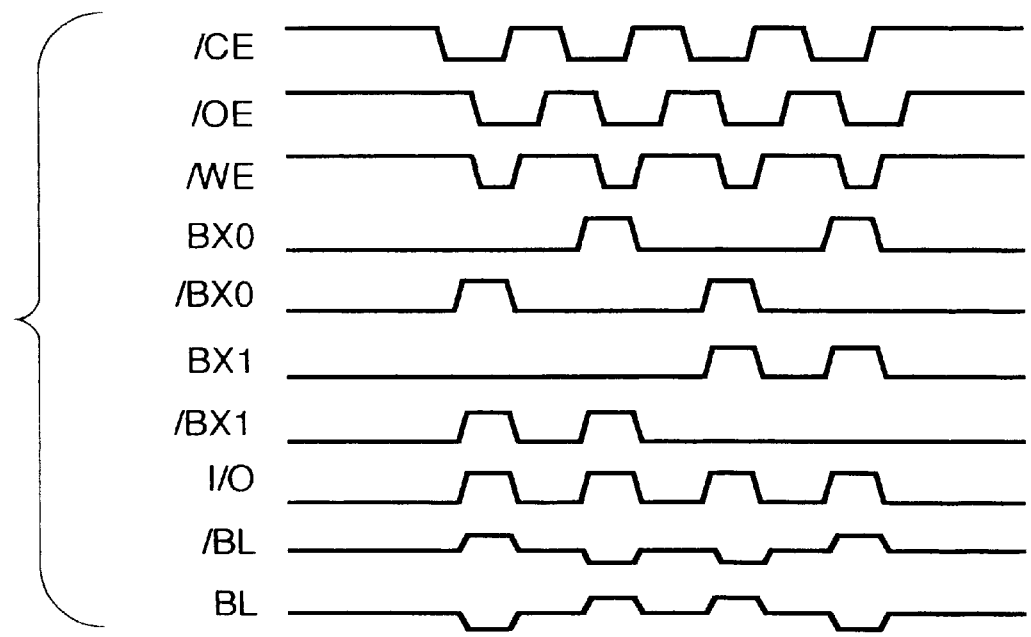

FIGS. 15(A) and 15(B) are respectively timing charts for explaining schematic functions of a data conversion circuit DSCR provided in the dynamic RAM according to the present invention. FIG. 15(A) shows a read operation under which a usual (normal) word line has been selected. FIG. 15(B) shows a write operation under which a usual (normal) word line has been selected.

In memory cells connected to bit lines /BL and BL upon the read operation shown in FIG. 15(A), input/output information differs from each of holding levels based on electric charges stored in capacitors Cs of the memory cells. Namely, when the memory cells connected to the bit line BL are connected to the word lines WL (1+4N) and WL (2+4N) selected as described above, the data conversion circuit DSCR outputs a read signal therefrom as it is. When the memory cells connected to the bit line /BL are connected to the word lines WL (0+4N) and WL (3+4N), the data conversion circuit DSCR inverts a read signal and outputs the inverted signal therefrom. Referring to FIG. 15(A), the data is inverted and outputted in the initial cycle as described above. In second and third cycles, the data is output as it is. In a fourth cycle, the data is inverted and output.

When memory cells connected to a bit line BL are connected to selected word lines WL (1+4N) and WL (2+4N) upon the write operation shown in FIG. 15(B) in correspondence to the aforementioned read operation, the data conversion circuit DSCR writes a read signal as it is. When memory cells connected to a bit line /BL are connected to selected word lines WL (0+4N) and WL (3+4N), the data conversion circuit DSCR inverts a read signal and writes it. Namely, as shown in FIG. 15(B), the data is inverted and written as described above in the initial cycle. In second and third cycles, the data is written as it is and the data is inverted and written in a fourth cycle.

Figure 16A:
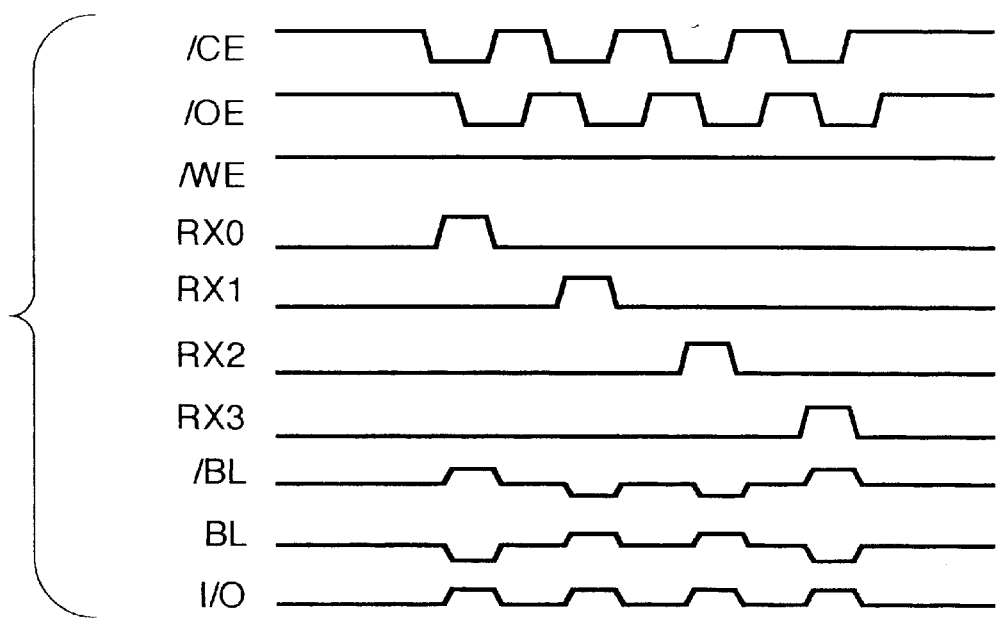
FIGS. 16(A) and 16(B) are respectively timing charts for describing schematic functions of the data conversion circuit DSCR at the time that redundant word lines employed in the dynamic RAM according to the present invention have been selected.
Figure 16B:
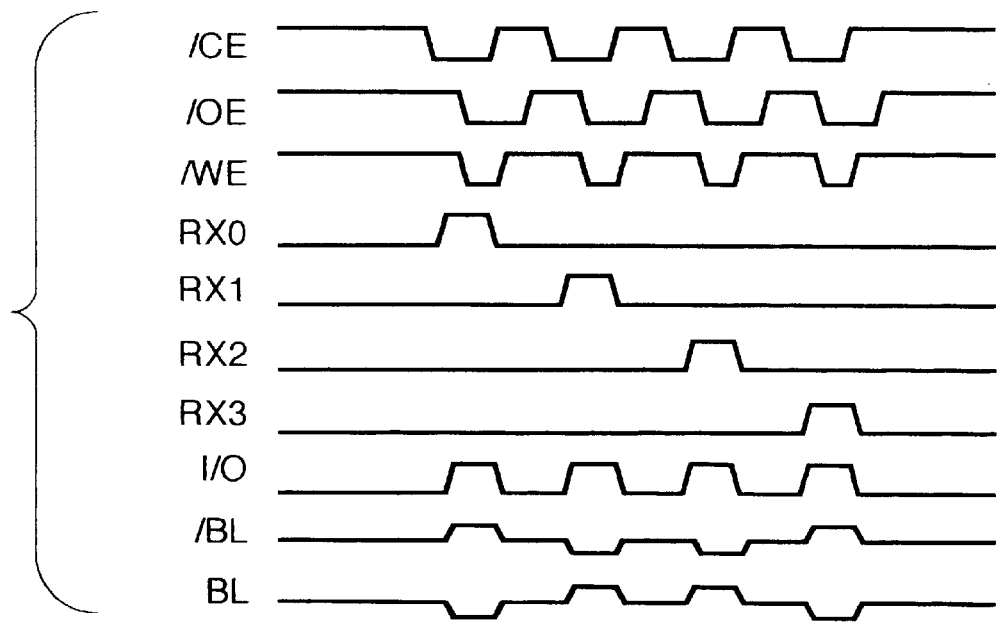

FIGS. 16(A) and 16(B) are respectively timing charts for describing schematic functions of a data conversion circuit DSCR at the time that redundant word lines employed in the dynamic RAM according to the present invention have been selected. FIG. 16(A) shows a read operation under which each redundant word line has been selected. FIG. 16(B) illustrates a write operation under which each redundant word line has been selected.

In memory cells connected to bit lines /BL and BL in the same manner as described above upon the read operation shown in FIG. 16(A), input/output information differs from each of holding levels based on electric charges stored in capacitors Cs of the memory cells. Namely, when the memory cells connected to the bit line BL are connected to redundant word lines RWL1 and RWL2 associated with the word lines WL (1+4N) and WL (2+4N), which are selected in accordance with RX1 and RX2 as described above, the data conversion circuit DSCR outputs a read signal as it is. When the memory cells connected to the bit line /BL are connected to redundant word lines RWL0 and RWL3 selected in accordance with RX0 and RX3, which are associated with the word lines WL (0+4N) and WL (3+4N), the data conversion circuit DSCR inverts a read signal and outputs it therefrom. Referring to FIG. 16(A), the data is inverted and outputted in the initial cycle as described above. In the second and third cycles, the data is outputted as it is. Further, the data is inverted and outputted in a fourth cycle.

When memory cells connected to a bit line BL are connected to selected redundant word lines RWL1 and RWL2 associated with the word lines WL (1+4N) and WL (2+4N) upon the write operation shown in FIG. 16(B) in correspondence to the aforementioned read operation, the data conversion circuit DSCR writes a read signal as it is. When memory cells connected to a bit line /BL are connected to selected redundant word lines RWL0 and RWL3 associated with the word lines WL (0+4N) and WL (3+4N), the data conversion circuit DSCR inverts a read signal and writes it. Namely, as shown in FIG. 16(B), the data is inverted and written,as described above,in the initial cycle. In second and third cycles, the data is written as it is and the data is inverted and written in a fourth cycle.

Thus, the same data is written into the two memory cells as shown in FIG. 13(B) thereby to execute a refresh operation in a refresh period or cycle set to a relatively long period corresponding to the average data holding time of each memory cell by the aforementioned temperature-dependent timer. Owing to the existence of memory cells which are likely to fall behind as described above, the memory cells in which the electric charges have been stored in the capacitors Cs lose their electric charges if the data holding time is less than the refresh cycle. However, if even one of the two memory cells holds the state of existence of the electric charge,since the OR of the data in the two memory cells is output upon reading, then no problem occurs because the one provides an output. Namely, since the probability that the two memory cells will be memory cells that are likely to be left behind can be regarded as nil, no problem arises even if the refresh cycle is set by the aforementioned average data holding time of each memory cell.

The setting of the refresh cycle to the aforementioned low power refresh period or cycle in a data holding state under battery backup, for example, at the time that a system such as a microcomputer or the like is cut off from the supply of power, makes it possible to greatly reduce power consumption. In other words, a significant difference of a figure or more exists between the data holding time of each memory cell that is likely to be left behind and the average data holding time of each memory cell. That is, a substantial time difference of the figure or more is provided between the period for the normal refresh operation based on the signal φSELF and the low power refresh period based on the signal φLSELF.

In the present embodiment, the use of the temperature-dependent timer circuit shown in FIG. 10 makes it possible to automatically fit the refresh cycle to the average data holding time of each memory cell in the dynamic RAM equipped with the temperature-dependent timer and set the refresh cycle while following a change in temperature about each memory cell and a change in source voltage.

Figure 17A:
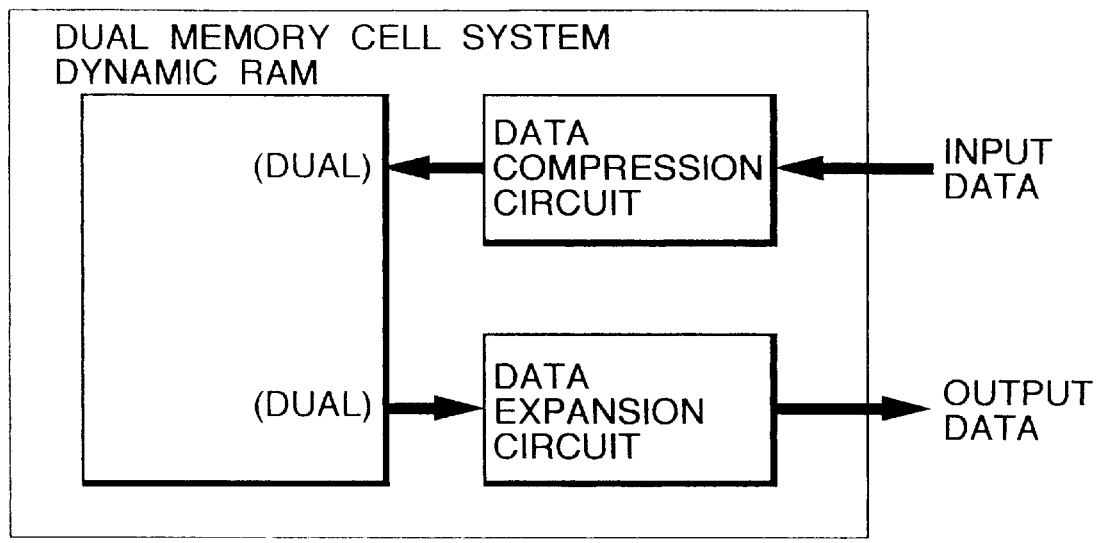
FIGS. 17(A) and 17(B) are respectively schematic block diagrams showing modifications of the dynamic RAM according to the present invention.
Figure 17B:
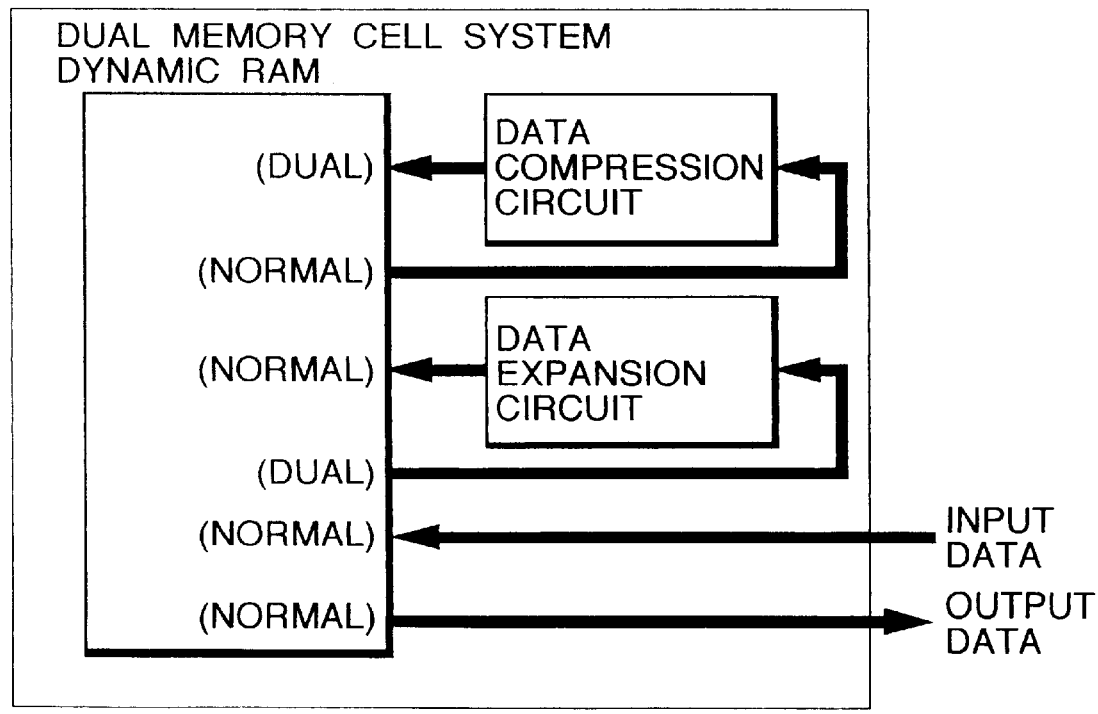

FIGS. 17(A) and 17(B) respectively show modifications of the dynamic RAM according to the present invention. When the dynamic RAM enters into the data holding state as described above, the dynamic RAM invalidates an address AX11 owing to the setting of the operation mode referred to above and simply selects two-surface address spaces simultaneously. Therefore, when effective data exist over the two surfaces, it is necessary to temporarily read out the data by a microprocessor or the like, compress it to ½ and effect the aforementioned write operation in this condition. When the dynamic RAM is returned to a memory access state from the data holding state, it is necessary to read out the compressed data by the microprocessor or the like, expand the data and return it to the address spaces extending to the two surfaces so as to be written therein.

In the present embodiment, the dynamic RAM itself has the aforementioned two functions of compressing and expanding the data. FIG. 17(A) shows an actual-time compressing process type dynamic RAM. Input data is compressed through a data compression circuit and stored in the dynamic RAM in a dual memory cell system. The ORing of signals read from the two memory cells,as described above, is output as read data and is restored to the original data by a data expansion circuit and outputted therefrom. In this case, the dynamic RAM is always activated in accordance with the aforementioned dual memory cell system. Therefore, a refresh operation is also set to a relatively long period or cycle according to or in unison with the average data holding time of each memory cell by the temperature-dependent timer circuit.

Figure 20:
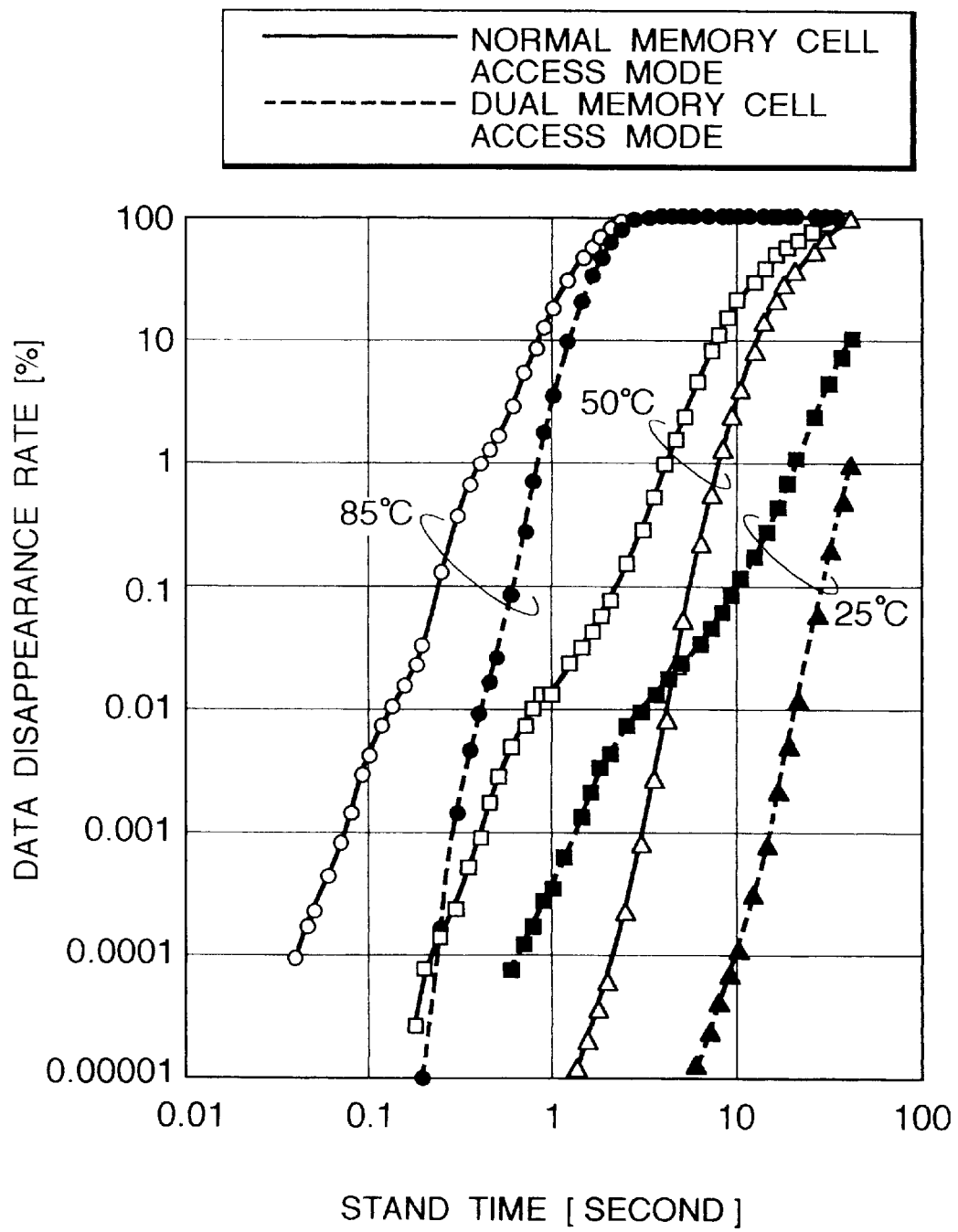
FIG. 20 is a characteristic diagram for describing the relationship between a stand time and the rate of disappearance of data both employed in a standard conventional dynamic RAM.

FIG. 20 is a characteristic diagram for describing the relationship between a leaving or stand time and the rate of disappearance of data both employed in a standard conventional dynamic RAM. Since the probability that data will be held for an arbitrary time before it leaves a single arbitrary memory cell in the dynamic RAM is equivalent to the rate of data disappearance in the same drawing, it is statistically apparent that the probability that data will disappear under a dual memory cell system, in which two memory cells similar to the above are connected to each other, is equal to the square of the above probability in the case of the single memory cell. A dual memory cell mode shown in the same drawing is of a characteristic diagram statistically obtained based on the data disappearance rate of the standard dynamic RAM.

Figure 21:
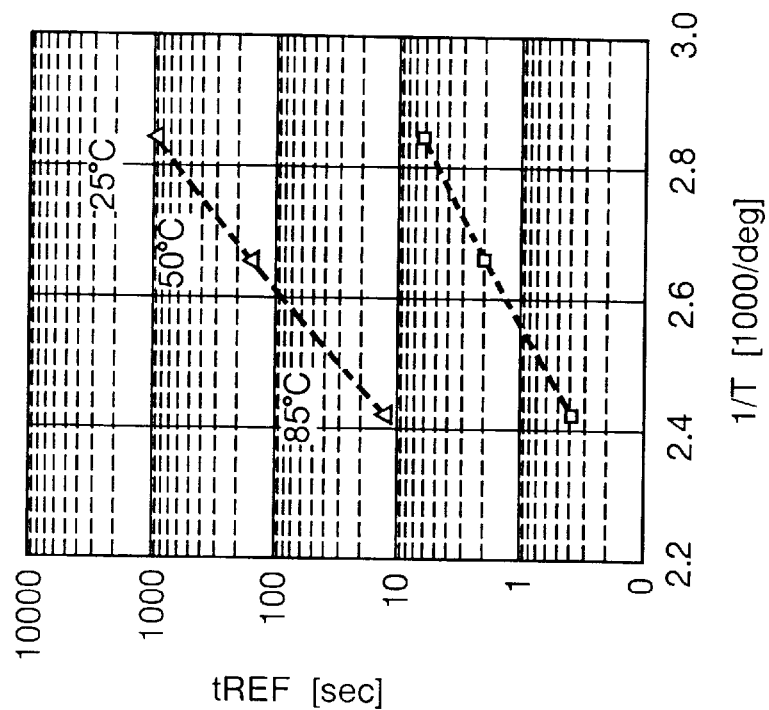
Figure 21:
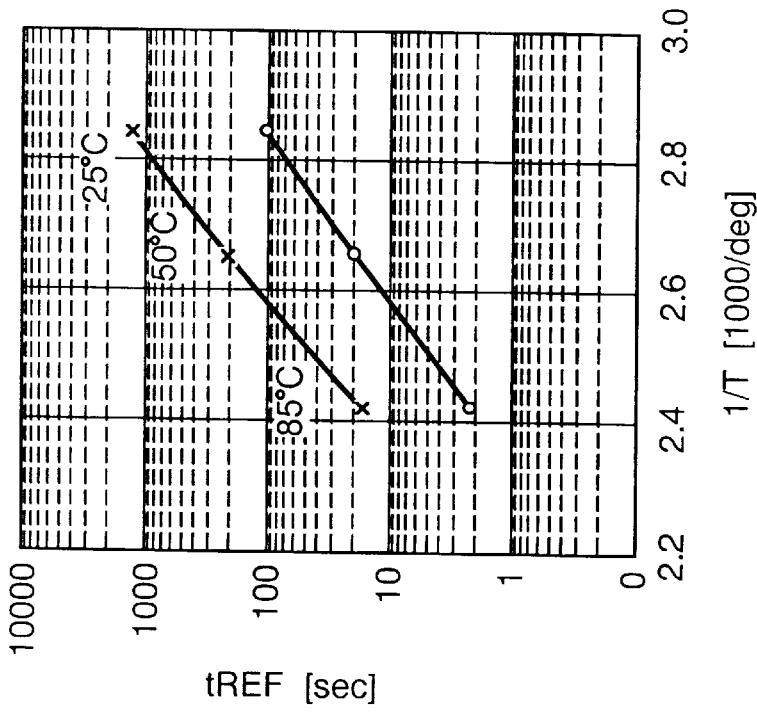

FIGS. 21(A) and 21(B) are respectively characteristic diagrams of refresh operations dependent on temperatures, which have experimentally been obtained in the aforementioned dynamic RAM. FIG. 21(B) shows the worst time for a normal memory cell (single memory cell) and the time during which memory cells corresponding to 50% of the entire memory cells will disappear. In a normal single memory cell mode as shown in the same drawing, the 50% disappearance time is different in temperature dependence from the time necessary for the worst cells to disappear and hence the former is longer than the latter. FIG. 21(A) illustrates the worst time at the time of the operation of a dual memory cell mode and the time during which memory cells equivalent to 50% of the entire memory cells will disappear.

Since the temperature-dependent timer used upon the self-refresh mode has temperature dependence substantially similar to the temperature dependence in the 50% disappearance time, the period or cycle of the self-refresh timer is required to be set so as not to exceed a worst case time under a low temperature. It is therefore necessary to make the cycle thereof shorter than a suitable timer cycle on the high temperature side. Thus, the optimum power reduction cannot be achieved. Since, however, the 50% disappearance time is substantially equal in temperature dependence to the time necessary for the worst cells to disappear in the dual memory cell mode, the most suitable power reduction can be made.

Figure 22:
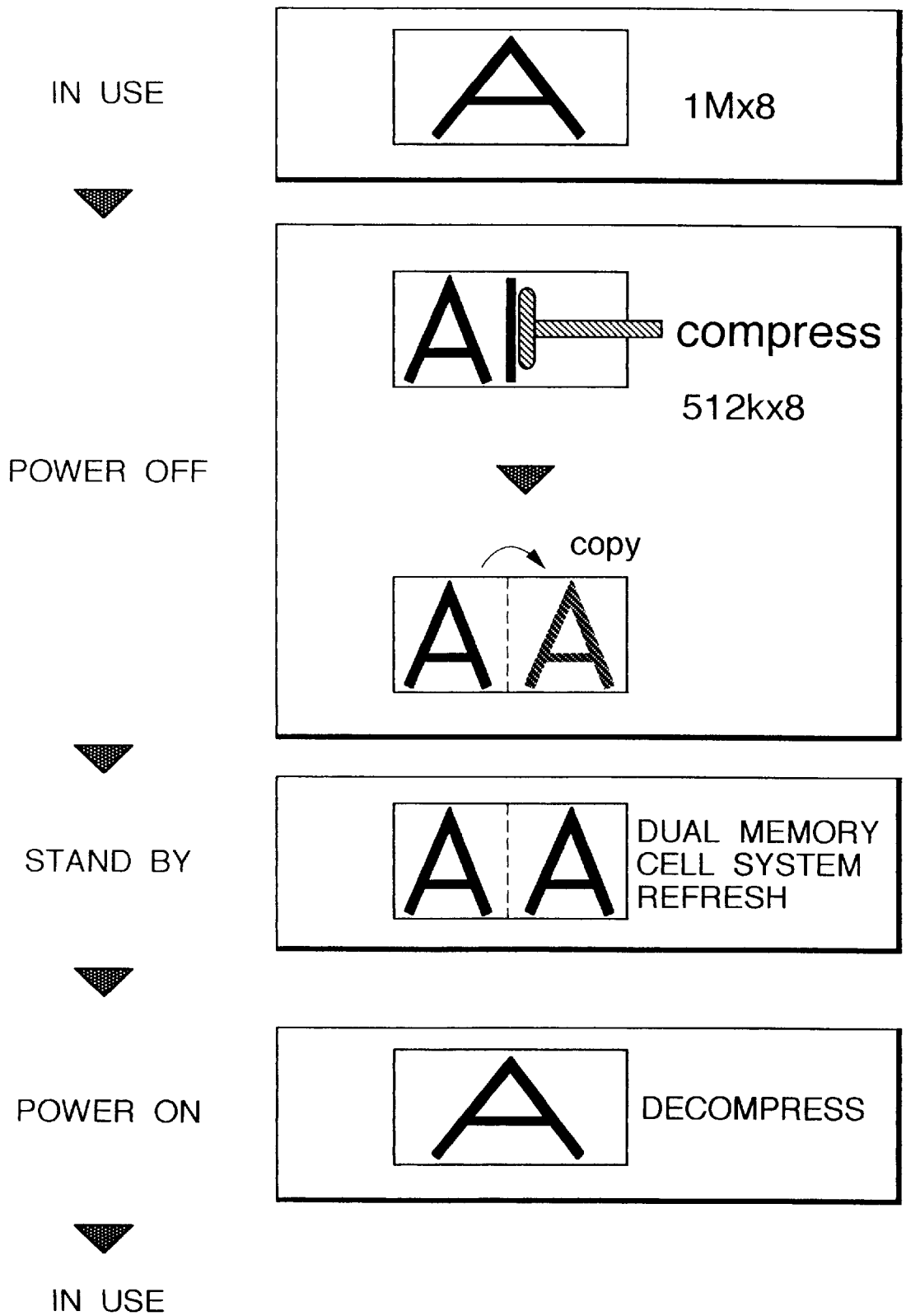
FIG. 22 is a general view of the operation of a dynamic RAM equipped with a dual memory cell mode, according to the present invention, which has been applied to a portable device.

FIG. 22 is a general view of the operation of a dynamic RAM according to the present invention, which is provided with a dual memory cell mode and which has been applied to a portable device (such as a portable information terminal or the like). When the system is in operation or use, the dynamic RAM is used as a 8-Mbit (1M×8) memory, for example. Upon turning OFF a power or power source (or Immediately after its turning OFF), data in the memory is compressed to ½ (may be compressed to ⅓ or less) in accordance with a specific algorithm and such data is brought into a duplex form so as to be copied onto its corresponding memory cell. Upon standby, the data is held by the self-refresh of the aforementioned temperature-dependent timer or the like in accordance with the dual memory cell system.

Prior to the putting of the system into use since the turning ON of the power source, the duplexed data is decompressed (subjected to a state opposite to the compression). The following methods are known as data compressing methods, which are generally known at present:

(1) RUN LENGTH method
(2) LZW method
(3) Arithmetic method
(4) DCT method
(5) Vector quantizing method In an application system, the optimum one of these data compressing methods is selected from one type or a plurality of types according to the type of data. Whether or not data should be compressed is selected for each memory storage area, i.e., depending on a data area or system program area. Incidentally, the function of compressing the data may be executed by a software-like process based on software by a microprocessor installed in the system or by dedicated hardware.

FIG. 17(B) shows a self compression process type dynamic RAM, which has a normal memory cell access mode and a dual memory cell access mode. That is, the dynamic RAM is externally subjected to a read/write operation as the normal memory cell access mode.

When the system falls into a data holding state such as a power cutoff or the like, the normal data referred to above is compressed by a data compression circuit and written into the dynamic RAM in accordance with a dual memory cell system. Therefore, the refresh operation is also set to a relatively long period or cycle according to the average data holding time of each memory cell by the aforementioned temperature-dependent timer circuit in the data holding state.

Upon the initial operation under which a data processing operation is started after the supply of the power to the system, the data held in accordance with the dual memory cell system is read and expanded by a data expansion circuit so as to be restored to the original state, after which the data is stored in the dynamic RAM. Thereafter, the dynamic RAM is brought to the normal memory cell access mode, followed by subjecting the same to the read/write operation by a microprocessor or the like.

The compressed data formed by the data compression circuit is written back to the dynamic RAM using even a space area of the dynamic RAM.

The data compression circuits and the data expansion circuits shown in FIGS. 17(A) and 17(B) may be respectively formed on semiconductor chips different from the dynamic RAM as input/output interface circuits of dynamic RAMs as well as being mounted on the same chips together with the dynamic RAM.

Figure 18:
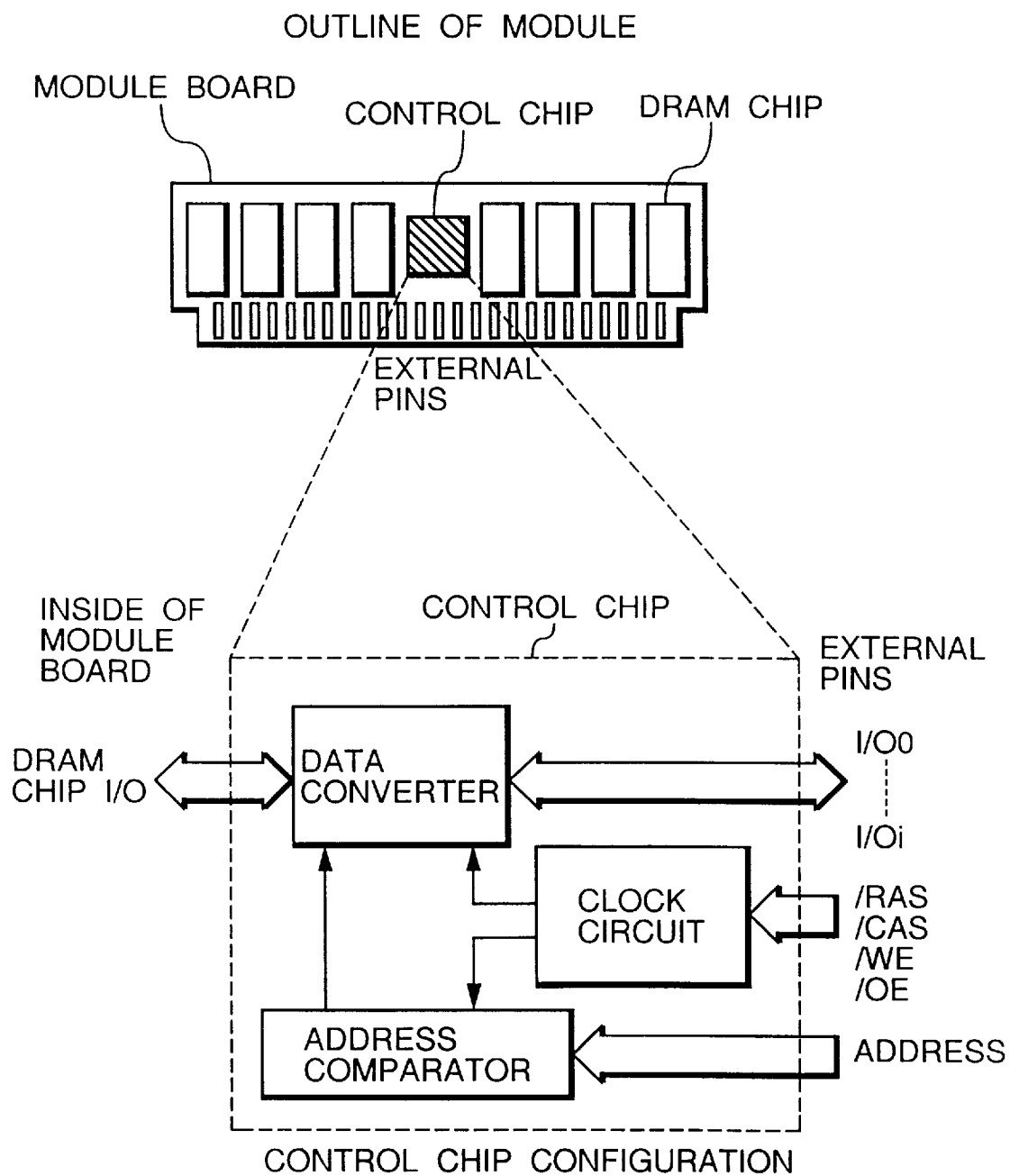
FIG. 18 is a configurational view illustrating one embodiment of a memory module according to the present invention.

FIG. 18 is a configurational view illustrating one embodiment of a memory module according to the present invention. The memory module according to the present embodiment comprises a plurality of DRAM chips and a control chip both mounted on a module board (mounted substrate). The control chip is composed of a data converter associated with the aforementioned data conversion circuit DSCR, an address comparator and a clock circuit as shown in an enlarged diagram of the control chip. Namely, a combination of the plurality of dynamic RAMs constructed as shown in FIGS. 1 and 2 and the control chip is configured as a memory module or memory system.

Each of the DRAM chips is composed of a standard dynamic RAM of a conventional address multi system. It is noted that each individual DRAM chip is handled as one associated with a part of each of the memory arrays MARY0 through MARY3 or the like shown in FIG. 1. The clock circuit makes a mode decision in response to signals /RAS, /CAS, /WE and /OE and performs switching between address signals for a normal memory cell access operation and a dual memory cell access operation. Thus, one semiconductor memory device of such a type that the standard DRAM chip is regarded as one of the aforementioned memory arrays, on the mounted substrate, and is formed in combination with the control chip thereby to perform an operation equal to the aforementioned embodiment.

Figure 19:
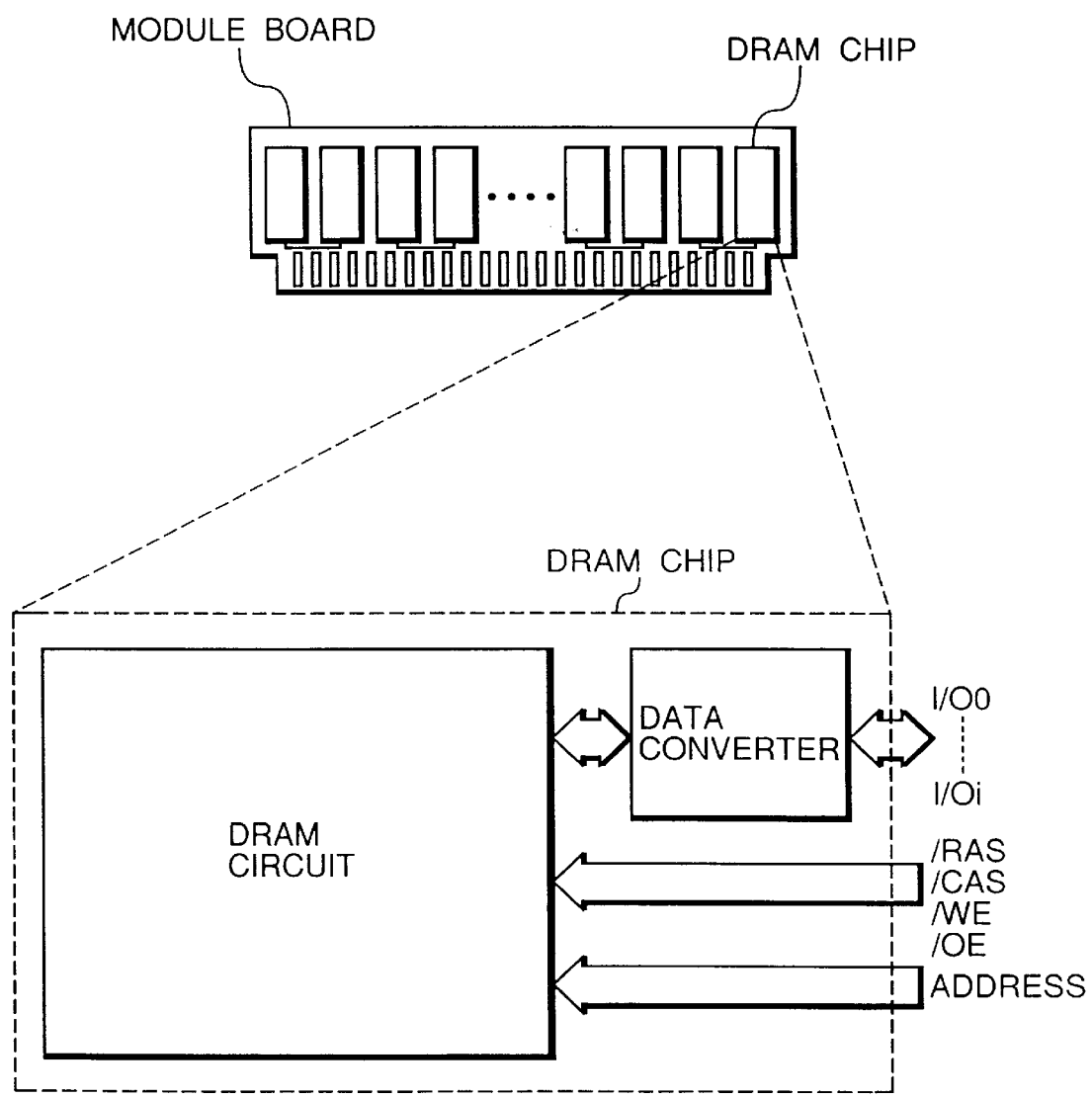
FIG. 19 is a configurational view showing another embodiment of the memory module according to the present invention.

FIG. 19 is a configurational view showing another embodiment of the memory module according to the present invention. The memory module according to the present embodiment is composed of an even number of DRAM chips mounted on a module board (mounted substrate). The DRAM according to the present embodiment is configured as the aforementioned two-intersection bit line system. However, a data converter similar to the above is incorporated in the DRAM. Further, a logic 1 (e.g., high level) of data written from an external terminal is associated with a state in which an electric charge exists in a capacitor of each memory cell, whereas a logic 0 (e.g., low level) of the written data is associated with a state in which no electric charge exists in the capacitor of each memory cell.

Since the written data may be read out from each DRAM chip as it is, it is unnecessary to set the logic 1 or 0 of the written signal in one-to-one correspondence with the state of existence or non-existence of the charge in each memory cell. Therefore, each DRAM equipped with the aforementioned data converter and each data converter-free DRAM can be also utilized in the same manner as described above. However, two sets of input/output terminals IO0 through I/Oi of the two DRAMs respectively having the data converters incorporated therein are connected in parallel so as to correspond to one another and they are mounted on a single mounted substrate as memory modules. Although not restricted in particular, wired OR logic is incorporated in an output circuit of each data converter referred to above using an open drain output circuit or the like.

Owing to the simple construction that output terminals of the two DRAM chips each capable of utilizing the aforementioned wired OR logic are electrically connected to their corresponding data patterns or wires on the mounted substrate as a pair, the normal stored data can be read from the other of the two DRAM chips even if the destruction of information occurs in memory cells of one of the DRAM chips due to the leak current although only the storage capacity equal to one-half the entire storage capacity of the DRAM chips provided on the mounted substrate is provided. It is therefore possible to enhance reliability. Further, since the refresh cycle of each DRAM chip can be made longer than the conventional refresh cycle over about one figure or more, the low power consumption can be achieved.

When the aforementioned open drain output circuit is used, the unified data conversion operation may be carried out so that the electric charge exists in the capacitor of each memory cell in correspondence with the low level of the logic 0. A source follower output MOSFET can be used as the output circuit capable of using the wired OR logic. In this case, the unified data conversion operation may be done so that the charge exists in the capacitor of each memory cell in correspondence with the high level of the logic 1.

Operations and effects obtained from the aforementioned embodiments are as follows:

(1) A dynamic RAM having a plurality of memory arrays, wherein dynamic memory cells each composed of an address selection MOSFET and an information storage capacitor respectively are provided at points of intersection of complementary bit line pairs of folded-bit line type and word lines in matrix form, is provided with a circuit for performing data conversion that the two dynamic memory cells respectively located in different memory arrays are simultaneously selected in accordance with the designation of a specific write operation mode, a logic 1 of a write signal is associated with a state in which an electric charge exists in the corresponding capacitor and a logic 0 of the write signal is associated with a state in which no electric charge exists in either of the capacitors of the selected memory cells, thereby writing the same write signal, a circuit for performing data conversion that two dynamic memory cells in the different memory arrays are simultaneously selected in accordance with the designation of a specific read operation mode, and in response to the write operation, a state in which an electric charge exists in a capacitor of each of the two dynamic memory cells, referred to above, is associated with a logic 1 of a read signal and a state in which no electric charge exists in either of the capacitors is associated with a logic 0 of the read signal, and a circuit for outputting a logic 1 level as the read signal under a condition in which either or both of the selected two memory cells have an electric charge stored therein indicative of a logic 1 write signal. Thus an advantageous effect can be obtained that since the same data is stored in the two memory cells in a data holding state or the like under the provision of such circuits, the data can be held with high reliability and a substantial reduction in power consumption can be achieved because a refresh cycle can be made longer according to the average memory cell.

(2) In the specific write mode and read mode as described above, the state in which the electric charge exists in each capacitor is defined as the logic 1 and the charge-free state is defined as the logic 0 by a data conversion circuit. Further, the above data are read out in response to the write and read operations by the data conversion circuit and a signal indicative of the OR of the read signals produced from the above two memory cells is outputted by the data conversion circuit. Thus, an advantageous effect can be obtained that since a leakage current brings the charge-existing state into the charge-free state, the proper stored information can be taken out from the other of the two memory cells even if the charge stored in one of the two memory cells is destroyed due to the leakage current, thereby making it possible for the memory to hold the data with high reliability.

(3) The specific write operation mode is performed immediately before the execution of a self-refresh mode relative to the dynamic memory cells and the specific read operation mode is carried out immediately after completion of the self-refresh mode. Further, a self-refresh cycle or period in the self-refresh mode is set up in accordance with each memory cell having the average information holding time. It is, therefore, possible to bring about an advantageous effect that power consumption can be greatly reduced.

(4) An advantageous effect can be obtained that the aforementioned self-refresh cycle can be associated with temperature- and source-dependencies of each dynamic memory cell by setting the self-refresh cycle with a timer circuit which is provided with a storage or accumulation capacitor simulating each dynamic memory cell, a precharge circuit provided for the accumulation capacitor and a voltage detecting circuit for detecting a potential of the accumulation capacitor, and a refresh cycle associated with each memory cell having the average data holding time can be established.

(5) Owing to the provision of the function of simultaneously selecting two memory cells at different addresses in accordance with the designation of a specific write operation mode and simultaneously writing data whose number of data bits is compressed to half or less, the function of simultaneously selecting two memory cells at the different addresses in accordance with the designation of a specific read operation mode, expanding a signal corresponding to the substantial OR of data signals read from the memory cells so as to restore it to the original number of bits and reading it, and the function of writing or reading the data composed of the number of data bits referred to above as it is in a normal operation mode, an advantageous effect can be obtained that while the storage capacity under real use is being increased, the data can be held with high reliability and power consumption can be greatly reduced.

(6) A plurality of dynamic RAMs each having a plurality of memory arrays in each of which dynamic memory cells each composed of an address selection MOSFET and an information storage capacitor are respectively provided at points of intersection of complementary bit line pairs of folded-bit line type and word lines in matrix form; and a control chip comprising a data conversion circuit for performing data conversion for validating memory cells in the two dynamic RAMs upon a simultaneously-selecting specific write operation, associating a logic 1 of a write signal with a state in which an electric charge exists in each capacitor referred to above and associating a logic 0 of the write signal with a state in which no electric charge exists in each capacitor and for performing data conversion for validating the memory cells in the two dynamic RAMs upon a simultaneously-selecting specific read operation, allowing the state of existence of the charge in the capacitor in each dynamic memory cell referred to above to correspond to a logic 1 of a read signal and allowing the charge-free state of each capacitor to correspond to a logic 0 of the read signal, and a logical OR circuit for outputting a signal corresponding to the OR of the data-converted two read signals produced from the two different dynamic RAMs as a read signal, are provided on a single mounted substrate to configure a memory system. Owing to such a construction,. the data can be held with high reliability and a refresh period or cycle can be made long in agreement with the average memory cell, thereby making it possible to bring about an advantageous effect that a memory system capable of providing a substantial reduction in power consumption can be implemented.

(7) An even number of semiconductor memory devices each comprising memory arrays wherein dynamic memory cells each composed of an address selection MOSFET and an information storage capacitor are respectively provided at points of intersection of individual pairs of complementary bit lines and word lines in matrix form and a data conversion circuit for performing data conversion such that in a write operation mode, a write signal having one level brings the information storage capacitor in each memory cell referred to above into a charge-existing state and brings the information storage capacitor into a charge-free state and performing data conversion associated with the write mode in a read mode, are provided on a single mounted substrate. The same data is written into the semiconductor memory devices of these semiconductor memory devices, which are provided two by two, and logical OR signals are output from the two semiconductor memory device pairs. As a result, an advantageous effect can be brought about that since the data can be held with high reliability and a refresh cycle can be made long in agreement with the average memory cell, a memory system capable of providing a substantial reduction in power consumption can be achieved.

Thus, the invention, which has been completed by the present inventors, has been described in detail in conjunction with the exemplified embodiments. However, the invention of the present application is not necessarily limited to the aforementioned embodiments. It is needless to say that many changes and modifications can be made thereto without departing from the spirit or scope of the invention as set forth herein. For example, configurations of memory arrays and configurations of their peripheral circuits can take various forms including that shown in the disclosed embodiments. When complementary bit lines are allowed to intersect at their intermediate portion, it is necessary to reverse the aforementioned data conversion at the portion of their intersection. Therefore, an address signal specified to such an intersecting portion may be utilized.

Advantageous effects obtained by typical ones of the invention disclosed in the present application will be briefly described as follows:

A dynamic RAM having a plurality of memory arrays, wherein dynamic memory cells each composed of an address selection MOSFET and an information storage capacitor respectively are provided at points of intersection of complementary bit line pairs of folded-bit line type and word lines in matrix form, is provided with a circuit for performing data conversion such that the two dynamic memory cells in respectively different memory arrays are simultaneously selected in accordance with the designation of a specific write operation mode, a logic 1 of a write signal is associated with a state in which an electric charge exists in the corresponding capacitor and a logic 0 of the write signal is associated with a state in which no electric charge exists in the capacitor, thereby writing the same write signal, a circuit for performing data conversion that two dynamic memory cells in the different memory arrays are simultaneously selected in accordance with the designation of a specific read operation mode, and in response to the write operation, a state in which an electric charge exists in a capacitor of each of the two dynamic memory cells referred to above, is associated with a logic 1 of a read signal and a state in which no electric charge exists in the capacitor, is associated with a logic 0 of the read signal, and a circuit for outputting a logic 1 level as the read signal under a condition in which either or both of the selected two memory cells have an electric charge stored therein indicative of a logic 1 write signal. Thus, since the same data is stored in the two memory cells in a data holding state or the like under the provision of such circuits, the data can be held with high reliability and a substantial reduction in power consumption can be achieved because a refresh cycle can be made longer according to the average memory cell.

In the specific write mode and read mode as described above, the state in which the electric charge exists in each capacitor is defined as the logic 1 and the charge-free state is defined as the logic 0 by a data conversion circuit. Further, the above data are read out in response to the write and read operations by the data conversion circuit and a signal indicative of the OR of the read signals produced from the above two memory cells is outputted by the data conversion circuits Thus, since a leakage current brings the charge-existing state into the charge-free state, the proper stored information can be taken out from the other of the two memory cells even if the charge stored in one of the two memory cells is destroyed due to the leakage current, thereby making it possible to hold the data with high reliability.

The specific write operation mode is done immediately before a self-refresh mode relative to the dynamic memory cells and the specific read operation mode is carried out immediately after completion of the self-refresh mode. Further, a refresh cycle or period in the self-refresh mode is set up in agreement with each memory cell having the average information holding time. It is therefore possible to greatly reduce power consumption.

By setting the self-refresh cycle with a timer circuit provided with a storage or accumulation capacitor formed by simulating each dynamic memory cell, a precharge circuit provided so as correspond to the accumulation capacitor and a voltage detecting circuit for detecting a potential of the accumulation capacitor, the self-refresh cycle can be associated with temperature- and source-dependencies of each dynamic memory cell and a refresh cycle associated with each memory cell having the average data holding time can be established.

Owing to the provision of the function of simultaneously selecting two memory cells at different addresses in accordance with the designation of a specific write operation mode and simultaneously writing data whose number of data bits is compressed to half or less, the function of simultaneously selecting two memory cells at the different addresses in accordance with the designation of a specific read operation mode, expanding a signal corresponding to the substantial OR of data signals read from the memory cells so as to restore it to the original number of bits and reading it, and the function of writing or reading the data composed of the number of data bits referred to above as it is in a normal operation mode, the data can be held with high reliability and power consumption can be greatly reduced while the storage capacity under real use is being increased.

A plurality of dynamic RAMs each having a plurality of memory arrays in each of which dynamic memory cells each composed of an address selection MOSFET and an information storage capacitor are respectively provided at points of intersection of complementary bit line pairs of folded-bit line type and word lines in matrix form; and a control chip comprising a data conversion circuit for performing data conversion for validating memory cells in the two dynamic RAMs upon a simultaneously-selecting specific write operation, associating a logic 1 of a write signal with a state in which an electric charge exists in each capacitor referred to above and associating a logic 0 of the write signal with a state in which no electric charge exists in each capacitor and for performing data conversion for validating the memory cells in the two dynamic RAMs upon a simultaneously-selecting specific read operation, allowing the state of existence of the charge in the capacitor in each dynamic memory cell referred to above to correspond to a logic 1 of a read signal and allowing the charge-free state of each capacitor to correspond to a logic 0 of the read signal, and a logical OR circuit for outputting a signal corresponding to the OR of the data-converted two read signals produced from the two different dynamic RAMs as a read signal, are provided on a single mounted substrate to configure a memory system. Owing to such a construction, the data can be held with high reliability and a refresh period or cycle can be made long in agreement with the average memory cell, thereby making it possible to achieve a memory system capable of providing a substantial reduction in power consumption.

An even number of semiconductor memory devices each comprising memory arrays wherein dynamic memory cells each composed of an address selection MOSFET and an information storage capacitor are respectively provided at points of intersection of individual pairs of complementary bit lines and word lines in matrix form and a data conversion circuit for performing data conversion such that in a write operation mode, a write signal having one level brings the information storage capacitor in each memory cell referred to above into a charge-existing state and a write signal having the other level brings the information storage capacitor into a charge-free state and performing data conversion associated with the write mode in a read mode, are provided on a single mounted substrate. The same data is written into the semiconductor memory devices of these semiconductor memory devices, which are provided two by two, and a logical OR signal is output from each pair of two semiconductor memory devices. Thus, since the data can be held with high reliability and a refresh cycle can be made long in agreement with the average memory cell, a memory system capable of providing a substantial reduction in power consumption can be materialized.

What is claimed is:

1. A memory system comprising:

a plurality of dynamic RAMs each having a plurality of memory arrays in each of which dynamic memory cells, each including an address selection MOSFET and an information storage capacitor coupled thereto, are respectively provided at points of intersection of complementary bit line pairs of folded-bit line type and word lines in matrix form; and a control chip including a data converter, which performs data conversion for validating memory cells in a pair of dynamic RAMs upon simultaneously-selecting a specific write operation, associating a logic 1 of a write signal with a state in which an electric charge exists in said each capacitor and associating a logic 0 of the write signal with a state in which no electric charge exists in said each capacitor, which performs data conversion for validating the memory cells in the pair of dynamic RAMs upon simultaneously-selecting a specific read operation, allowing the state of existence of the charge in the capacitor in said each dynamic memory cell to correspond to a logic 1 of a read signal and allowing the charge-free state of said each capacitor to correspond to a logic 0 of the read signal, and which outputs a signal corresponding to the OR of the data-converted two read signals produced from the two different dynamic RAMs as a read signal, wherein said plurality of dynamic RAMs and said control chip are provided on a single mounted substrate.

2. A memory system according to claim 1, wherein said specific write operation is executed immediately before the execution of a self-refresh mode relative to said each dynamic RAM, said specific read operation is done immediately after completion of the self-refresh mode and a refresh cycle in the self-refresh mode is set according to said each memory cell of said dynamic RAM, which has an average information holding time.

3. A memory system comprising:

an even number of semiconductor memory devices provided on a single mounted substrate, each including:

a plurality of memory arrays each having dynamic memory cells each including an address selection MOSFET and an information storage capacitor coupled thereto, said memory cells being provided in matrix form at points of intersection of each individual pair of complementary bit lines and word lines; and a data conversion circuit which performs data conversion such that in a write operation mode, a write signal having one level brings the information storage capacitor in said each memory cell into a charge-existing state and a write signal having the other level brings the information storage capacitor into a charge-free state and which performs data conversion associated with said write operation mode in a read mode, whereby the same data is written into the semiconductor memory devices of said even number of semiconductor memory devices, which are provided two by two and a logical OR signal is output from said each pair of two semiconductor memory devices.

4. A memory system according to claim 2, wherein said self-refresh cycle is set by a timer circuit, associated with each dynamic RAM, equipped with a storage capacitor simulating each dynamic memory cell, a precharge circuit coupled to the storage capacitor and a voltage detecting circuit for detecting a potential of said storage capacitor.

5. A memory system according to claim 2, wherein said control circuit further includes a clock circuit which decides on an operation mode in accordance with control signals applied thereto and performs switching between address signals for a normal memory cell access operation and a dual memory cell access operation.

6. A memory system according to claim 5, wherein said applied control signals include a row address strobe (/RAS), a column address strobe (/CAS), a write enable signal (/WE) and an output enable signal (/OE).

7. A memory system according to claim 1, wherein said data converter includes:
 a write data conversion circuit which is activated in accordance with a designation of a specific write mode, said write data conversion circuit being coupled to supply a source voltage to one bit line of a bit line pair in both of said pair of dynamic RAMs which is coupled to the memory cell having the same address and to be written with a write level corresponding to a write signal of a logic 1 and supply a low level, corresponding to a circuit ground potential, to said one bit line when a write level corresponding to a logic 0 is transferred to those same two memory cells; and
 a read data conversion circuit which is activated in accordance with a designation of a specific read mode, said read data conversion circuit setting a read signal of a high level obtained from one of said two memory cells, upon selection of the word line coupled thereto, as a read signal corresponding to a logic 1 and setting a read signal of a relatively low level obtained from said one memory cell as a read signal corresponding to a logic 0 signal and said read data conversion circuit setting a read signal of the high level obtained from the other one of said two memory cells, upon selection of the word line coupled thereto, as a read signal corresponding to a logic 1 and setting a read signal of a low level obtained from said other memory cell as a read signal corresponding to a logic 0.

8. A memory system according to claim 7, wherein the specific write and read modes are designated in accordance with application of a chip enable signal (/CE), an output enable signal (/OE) and a write enable signal (/WE).

9. A memory system according to claim 3, wherein each said data conversion circuit includes:
 a write data conversion circuit which is activated in accordance with a designation of a specific write mode, said write data conversion circuit being coupled to supply a source voltage to a pair of bit lines of a pair of memory arrays, respectively, which are coupled to a pair of memory cells having the same address and to be written with a write level corresponding to a logic 1 and supply a low level, corresponding to circuit ground potential, to said pair of bit lines when a write level corresponding to a logic 0 is to be transferred to those same pair of memory cells; and
 a read data conversion circuit which is activated in accordance with a designation of a specific read mode, said read data conversion circuit setting a read signal of a high level obtained from one of said pair of memory cells, upon selection of the word line coupled thereto, as a read signal corresponding to a logic 1 and setting a read signal of a relatively low level obtained from said one memory cell as a read signal corresponding to a logic 0 signal and said read data conversion circuit setting a read signal of the high level obtained from the other one of said pair of memory cells, upon selection of the word line coupled thereto, as a read signal corresponding to a logic 1 and setting a read signal of a low level obtained from said other memory cell as a read signal corresponding to a logic 0.

10. A memory system according to claim 9, wherein the specific write and read modes are designated in accordance with application of a chip enable signal (/CE), an output enable signal (/OE) and a write enable signal (/WE).

11. A memory system comprising:
 (i) a first chip comprising
  (a) a first word line,
  (b) a second word line,
  (c) a first complementary data line pair having a first data line and a second data line,
  (d) a first memory cell provided so as to correspond to a point of intersection of said first word line and said first data line,
  (e) a second memory cell provided so as to correspond to a point of intersection of said second word line and said second data line, and
  (f) a first sense amplifier connected to said first data line and to said second data line;
 (ii) a second chip comprising
  (a) a third word line,
  (b) a fourth word line,
  (c) a second complementary data line pair having a third data line and a fourth data line,
  (d) a third memory cell provided so as to correspond to a point of intersection of said third word line and said third data line,
  (e) a fourth memory cell provided so as to correspond to a point of intersection of said fourth word line and said fourth data line, and
  (f) a second sense amplifier connected to said third data line and to said fourth data line; and
 (iii) a circuit outputting a signal,
  wherein said signal is a first voltage when read data transferred from said first memory cell to said first data line is high in level and read data transferred from said third memory cell to said third data line is high in level,
  wherein said signal is said first voltage when read data transferred from said first memory cell to said first data line is high in level and read data transferred from said third memory cell to said third data line is low in level,
  wherein said signal is said first voltage when read data transferred from said first memory cell to said first data line is low in level and read data transferred from said third memory cell to said third data line is high in level, and
  wherein said signal is a second voltage when read data transferred from said first memory cell to said first data line is low in level and read data transferred from said third memory cell to said third data line is low in level.

12. A memory system according to claim 11, wherein each of said first, second, third and fourth memory cells is a dynamic memory cell.

13. A memory system according to claim 11, wherein said circuit is included in a third chip.

14. A memory system according to claim 13,
 wherein said third chip further comprises external terminals, and
 wherein said circuit outputs said signal to one of said external terminals.

15. A memory system according to claim 11, wherein said first voltage is of a high level voltage and said second voltage is of a low level voltage.

16. A memory system according to claim 11,
wherein said first chip further comprises a first main amplifier, and
wherein said second chip further includes a second main amplifier.

17. A memory system according to claim 11,
wherein said signal is said first voltage when read data transferred from said second memory cell to said second data line is high in level and read data transferred from said fourth memory cell to said fourth data line is high in level,
wherein said signal is said first voltage when read data transferred from said second memory cell to said second data line is high in level and read data transferred from said fourth memory cell to said fourth data line is low in level,
wherein said read signal is said first voltage when read data transferred from said second memory cell to said second data line is low in level and read data transferred from said fourth memory cell to said fourth data line is high in level, and
wherein said read signal is said second voltage when read data transferred from said second memory cell to said second data line is low in level and read data transferred from said fourth memory cell to said fourth data line is low in level.

18. A memory system according to claim 17, wherein said first voltage is a high level voltage and said second voltage is a low level voltage.

19. A memory system according to claim 11,
wherein said first word line and said third word line are simultaneously brought to a selection level, and
wherein said second word line and said fourth word line are simultaneously brought to a selection level.

20. A memory system according to claim 11, wherein a same address is assigned to said first and third word lines and a same address is assigned to said second and fourth word lines.

21. A memory system comprising:
a first chip comprising a plurality of first memory cells;
a second chip comprising a plurality of second memory cells; and
a third chip comprising a circuit connected to said first chip and to said second chip so as to output a signal therefrom,
wherein said signal is a first voltage when data stored in a respective first memory cell is high in level and data stored in a respective second memory cell is high in level in a case in which both said first memory cell and said second memory cell are selected for reading out,
wherein said signal is a first voltage when data stored in said first memory cell is high in level and data stored in said second memory cell is low in level in a case in which both said first memory cell and said second memory cell are selected for reading out,
wherein said signal is a first voltage when data stored in said first memory cell is low in level and data stored in said second memory cell is high in level in a case in which both said first memory cell and said second memory cell are selected for reading out, and
wherein said signal is a second voltage when data stored in said first memory cell is low in level and data stored in said second memory cell is low in level in a case in which both said first memory cell and said second memory cell are selected for reading out.

22. A memory system according to claim 21, wherein each of said plurality of first memory cells and each of said plurality of second memory cells comprises a transistor and a capacitor connected to said transistor.

23. A memory system according to claim 21, wherein said first voltage is of a high level voltage and said second voltage is of a low level voltage.

24. A memory system according to claim 21, further comprising:
a first sense amplifier connected to said first memory cells; and
a second sense amplifier connected to said second memory cells.

25. A memory system according to claim 21, further comprising:
a first amplifier which senses whether the selected memory cell in said first chip stores data of high level or low level; and
a second amplifier which senses whether the selected memory cell in said second chip stores data of high level or low level.

26. A memory system according to claim 21, further comprising a first amplifier and a second amplifier,
wherein each of said plurality of first memory cells and each of said plurality of second memory cells comprises a transistor and a capacitor connected to said transistor,
wherein said first amplifier detects whether the charge level of the capacitor in the selected one of said first memory cells is larger than a predetermined level or not, and
wherein said second amplifier detects whether the charge level of the capacitor in the selected one of said second memory cells is larger than a predetermined level or not.

27. A memory system comprising:
a first memory array comprising a plurality of first memory cells;
a second memory array comprising a plurality of second memory cells; and
a circuit connected to said first memory array and to said second memory array so as to output a signal therefrom,
wherein said signal is a first voltage when data stored in a respective first memory cell is high in level and data stored in a respective second memory cell is high in level in a case in which both said first memory cell and said second memory cell are accessed for reading out,
wherein said signal is a first voltage when data stored in said first memory cell is high in level and data stored in said second memory cell is low in level in a case in which both said first memory cell and said second memory cell are accessed for reading out,
wherein said signal is a first voltage when data stored in said first memory cell is low in level and data stored in said second memory cell is high in level in a case in which both said first memory cell and said second memory cell are accessed for reading out, and
wherein said signal is a second voltage when data stored in said first memory cell is low in level and data stored in said second memory cell is low in level in a case in which both said first memory cell and said second memory cell are accessed for reading out.

28. A memory system according to claim 27, wherein each of said plurality of first memory cells and each of said plurality of second memory cells comprises a transistor and a capacitor connected to said transistor.

29. A memory system according to claim 27,
wherein said first memory array is included in a first chip, and
wherein said second memory array is included in a second chip.

30. A memory system according to claim 27,
wherein said first memory array is included in a first chip,
wherein said second memory array is included in a second chip, and
wherein said circuit is included in a third chip.

31. A memory system according to claim 27,
wherein said first memory array and said circuit are included in a first chip, and
wherein said second memory array is included in a second chip.

32. A memory system according to claim 27, wherein said first memory array and said second memory array are formed in different semiconductor substrates.

33. A memory system according to claim 32, wherein each of said plurality of first memory cells and each of said plurality of second memory cells comprises a transistor and a capacitor connected to said transistor.

34. A memory system according to claim 32, wherein each of said plurality of first memory cells and each of said plurality of second memory cells comprises an address selection MOSFET and an information storage capacitor connected to said address selection MOSFET.

35. A memory system according to claim 27, wherein said first memory array and said second memory array are formed in a semiconductor substrate.

36. A memory system according to claim 35, wherein each of said plurality of first memory cells and each of said plurality of second memory cells comprises a transistor and a capacitor connected to said transistor.

37. A memory system according to claim 35, wherein each of said plurality of first memory cells and each of said plurality of second memory cells comprises an address selection MOSFET and an information storage capacitor connected to said address selection MOSFET.

38. A memory system according to claim 27, wherein said first voltage is of a high level voltage and said second voltage is of a low level voltage.

39. A memory system according to claim 27, further including:
a first sense amplifier connected between said first memory cells and said circuit; and
a second sense amplifier connected between said second memory cells and said circuit.

40. A memory system according to claim 27, further comprising:
a first amplifier which senses whether the accessed memory cell in said first memory array stores data of high level or low level; and
a second amplifier which senses whether the accessed memory cell in said second memory array stores data of high level or low level.

41. A memory system according to claim 27, further comprising:
a first amplifier which detects the level of stored data in the accessed memory cell of said first memory array; and
a second amplifier which detects the level of stored data in the accessed memory cell of said second memory array.

42. A memory system according to claim 27, further including a first amplifier and a second amplifier,
wherein each of said plurality of first memory cells and each of said plurality of second memory cells comprises a transistor and a capacitor connected to said transistor,
wherein said first amplifier detects whether the charge level of the capacitor in the accessed memory cell of said first memory array is larger than a predetermined level or not, and
wherein said second amplifier detects whether the charge level of the capacitor in the accessed memory cell of said second memory array is larger than a predetermined level or not.

43. A memory system according to claim 27, wherein said first memory cell being accessed in said first memory array is assigned a same address location as said second memory cell being accessed in said second memory array.

* * * * *